(12) United States Patent
Kim

(10) Patent No.: US 10,930,509 B2
(45) Date of Patent: Feb. 23, 2021

(54) SEMICONDUCTOR DEVICES AND METHODS OF MANUFACTURING THE SAME

(71) Applicant: Samsung Electronics Co., Ltd., Suwon-si (KR)

(72) Inventor: Ju Youn Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 367 days.

(21) Appl. No.: 15/862,768

(22) Filed: Jan. 5, 2018

(65) Prior Publication Data

US 2018/0366329 A1 Dec. 20, 2018

(30) Foreign Application Priority Data

Jun. 20, 2017 (KR) .................. 10-2017-0077667

(51) Int. Cl.
| | | |
|---|---|---|
| *H01L 21/28* | (2006.01) | |
| *H01L 21/762* | (2006.01) | |
| *H01L 27/088* | (2006.01) | |
| *H01L 29/423* | (2006.01) | |
| *H01L 29/66* | (2006.01) | |
| *H01L 21/8234* | (2006.01) | |
| *H01L 29/165* | (2006.01) | |
| *H01L 29/78* | (2006.01) | |

(52) U.S. Cl.
CPC ...... *H01L 21/28141* (2013.01); *H01L 21/762* (2013.01); *H01L 21/76224* (2013.01); *H01L 21/823431* (2013.01); *H01L 27/0886* (2013.01); *H01L 29/42336* (2013.01); *H01L 29/6659* (2013.01); *H01L 29/66545* (2013.01); *H01L 29/66795* (2013.01); *H01L 29/165* (2013.01); *H01L 29/7848* (2013.01)

(58) Field of Classification Search
CPC .......... H01L 27/0886; H01L 27/10882; H01L 27/10885; H01L 27/10891; H01L 21/823431; H01L 29/66795; H01L 21/28141; H01L 21/76224
See application file for complete search history.

(56) References Cited

U.S. PATENT DOCUMENTS

| | | |
|---|---|---|
| 6,970,372 B1 | 11/2005 | Furukawa et al. |
| 7,602,021 B2 | 10/2009 | Doris et al. |

(Continued)

*Primary Examiner* — Zandra V Smith
*Assistant Examiner* — Abbigale A Boyle
(74) *Attorney, Agent, or Firm* — Harness, Dickey & Pierce, P.L.C.

(57) ABSTRACT

A semiconductor device includes a fin-type pattern on a substrate, a first gate structure being on the fin-type pattern and including first gate spacers and a first gate insulating layer extending along sidewalls of the first gate spacers, a second gate structure being on the fin-type pattern and including second gate spacers and a second gate insulating layer extending along sidewalk of the second gate spacers, a pair of dummy spacers between the first gate structure and the second gate structure, a separation trench being between the pair of dummy spacers and having sidewalls defined by the pair of dummy spacers and the fin-type pattern, a device isolation layer in a portion of the separation trench, and a connection conductive pattern being on the device isolating layer and in the separation trench and contacting the pair of dummy spacers.

20 Claims, 26 Drawing Sheets

(56) References Cited

U.S. PATENT DOCUMENTS

| | | | |
|---|---|---|---|
| 7,898,037 B2 | 3/2011 | Chuang et al. | |
| 8,076,190 B2 | 12/2011 | Chen et al. | |
| 8,080,838 B2 | 12/2011 | Chang et al. | |
| 8,362,572 B2 | 1/2013 | Huang et al. | |
| 8,551,843 B1 * | 10/2013 | Cai | H01L 21/28123 |
| | | | 257/E21.19 |
| 8,598,641 B2 | 12/2013 | Chen et al. | |
| 8,642,416 B2 | 2/2014 | Or-Bach et al. | |
| 8,693,235 B2 | 4/2014 | Liaw | |
| 8,697,539 B2 | 4/2014 | Huang et al. | |
| 8,723,225 B2 | 5/2014 | Hu et al. | |
| 8,848,423 B2 | 9/2014 | Chung | |
| 8,866,235 B2 | 10/2014 | Wu et al. | |
| 8,952,547 B2 | 2/2015 | Liaw | |
| 9,035,306 B2 | 5/2015 | Hoentschel et al. | |
| 9,111,801 B2 | 8/2015 | Zhang | |
| 9,117,910 B2 | 8/2015 | Jeong et al. | |
| 9,209,201 B2 | 12/2015 | Lin et al. | |
| 9,368,502 B2 | 6/2016 | Chang et al. | |
| 9,395,489 B2 | 7/2016 | Cheng et al. | |
| 9,397,101 B2 | 7/2016 | Chintarlapalli Reddy et al. | |
| 9,412,616 B1 | 8/2016 | Xie et al. | |
| 9,418,189 B2 | 8/2016 | Lin et al. | |
| 9,431,513 B2 | 8/2016 | Liu et al. | |
| 9,478,641 B2 | 10/2016 | Huang et al. | |
| 9,515,172 B2 | 12/2016 | Shin et al. | |
| 9,530,777 B2 | 12/2016 | Loubet et al. | |
| 9,536,882 B2 | 1/2017 | Anderson et al. | |
| 9,536,964 B2 | 1/2017 | Shiao et al. | |
| 9,548,109 B2 | 1/2017 | Chung | |
| 10,566,326 B2 * | 2/2020 | Kwak | H01L 27/0886 |
| 2015/0021710 A1 | 1/2015 | Hsu et al. | |
| 2016/0099181 A1 * | 4/2016 | Tung | H01L 21/823814 |
| | | | 257/369 |
| 2016/0358913 A1 | 12/2016 | Kim | |
| 2017/0012000 A1 | 1/2017 | Tseng et al. | |

* cited by examiner

SEMICONDUCTOR DEVICES AND METHODS OF MANUFACTURING THE SAME

CROSS-REFERENCE TO RELATED APPLICATION

This application claims priority under 35 U.S.C. § 119 to Korean Patent Application No. 10-2017-0077667 filed on Jun. 20, 2017 in the Korean Intellectual Property Office, the disclosure of which is hereby incorporated by reference in its entirety.

BACKGROUND

Example embodiments of inventive concepts relate to semiconductor devices and methods for manufacturing the same.

In order to increase the integration of a semiconductor device, multi-gate transistors each including a fin-type multi-channel active pattern (or silicon body) on a substrate and a gate on the multi-channel active pattern have been proposed.

Since a multi-gate transistor uses a three-dimensional channel, the multi-gate transistor can be scaled. Further, current control capability can be improved without increasing a gate length of the multi-gate transistor. In addition, a short channel effect (SCE) that the electrical potential of the channel region is affected by the drain voltage can be effectively reduced or suppressed.

SUMMARY

According to some example embodiments of inventive concepts, a semiconductor device may include a fin-type pattern on a substrate, a first gate structure on the fin-type pattern, the first gate structure including first gate spacers and a first gate insulating layer extending along sidewalls of the first gate spacers, and a second gate structure on the fin-type pattern. The second gate structure may be spaced apart from the first gate structure and including second gate spacers and a second gate insulating layer extending along sidewalls of the second gate spacers. The semiconductor device further may include a pair of dummy spacers between the first gate structure and the second gate structure, a separation trench between the pair of dummy spacers, the separation trench having sidewalls defined by the pair of dummy spacers and the fin-type pattern, a device isolation layer in a portion of the separation trench and a connection conductive pattern on the device isolating layer and in the separation trench, the connection conductive pattern contacting the pair of dummy spacers.

According to some example embodiments of inventive concepts, a semiconductor device may include a fin-type pattern on a substrate, a first gate structure on the fin-type pattern, the first gate structure including first gate spacers defining a first gate trench and a first gate electrode filling at least a portion of the first gate trench, a second gate structure on the fin-type pattern, the second gate structure including second gate spacers defining a second gate trench and a second gate electrode filling at least a portion of the second gate trench, dummy spacers between the first gate structure and the second gate structure, a separation trench between the dummy spacers, the separation trench having sidewalls defined by the dummy spacers and the fin-type pattern, a device isolation layer in a portion of the separation trench, and a connection conductive pattern on the device isolation layer and in the separation trench, a width of the connection conductive pattern being greater than a width of each of the first and second gate electrodes.

According to some example embodiments of inventive concepts, a semiconductor device may include a fin-type pattern on a substrate, a first gate structure on the fin-type pattern, the first gate structure including first gate spacers defining a first gate trench and a first gate insulating layer extending along an inner surface of the first gate trench, a second gate structure on the fin-type pattern, the second gate structure including second gate spacers defining a second gate trench, and a second gate insulating layer extending along an inner surface of the second gate trench, dummy spacers between the first gate structure and the second gate structure, a separation trench between the dummy spacers, the separation trench having sidewalls defined by the dummy spacers and the fin-type pattern, a device isolation layer in a portion of the separation trench; the device isolation layer having an upper surface higher than an upper surface of the fin-type pattern with respect to an upper surface of the substrate, and a connection conductive pattern on the device isolation layer and in the separation trench. The first and second gate insulating layers include a high-k dielectric material, and an insulating layer including the high-k dielectric material is not formed between the connection conductive pattern and the device isolation layer.

According to some example embodiments of inventive concepts, a method of manufacturing a semiconductor device may include forming, on a fin-type pattern, an interlayer insulating layer including spaced first and second trenches, the first trench defined by gate spacers, the second trench defined by dummy spacers, forming a pre-high-k dielectric insulating layer including a first portion extending along an inner surface of the first trench and a second portion extending along an inner surface of the second trench, removing the second portion of the pre-high-k dielectric insulating layer and a portion of the fin-type pattern to form a separation trench that is defined by the dummy spacers and the fin-type pattern, forming a device isolation layer in a portion of the separation trench, and forming a connection conductive pattern on the device isolation layer to fill the separation trench.

DETAILED DESCRIPTION

Various example embodiments will now be described more fully hereinafter with reference to the accompanying drawings.

Although the drawings regarding a semiconductor device according to the example embodiments illustrate a fin-type transistor (FinFET) including a channel region in a fin-type pattern shape, example embodiments of inventive concepts are not limited thereto. In some example embodiments, a semiconductor device may include a tunneling transistor (FET), a transistor including nanowire, a transistor including nano-sheet, or a three-dimensional (3D) transistor. Further, a semiconductor device according to some example embodiments may include, for example, a bipolar junction transistor, and/or a laterally diffused metal oxide semiconductor (LDMOS) transistor.

Figure 1:
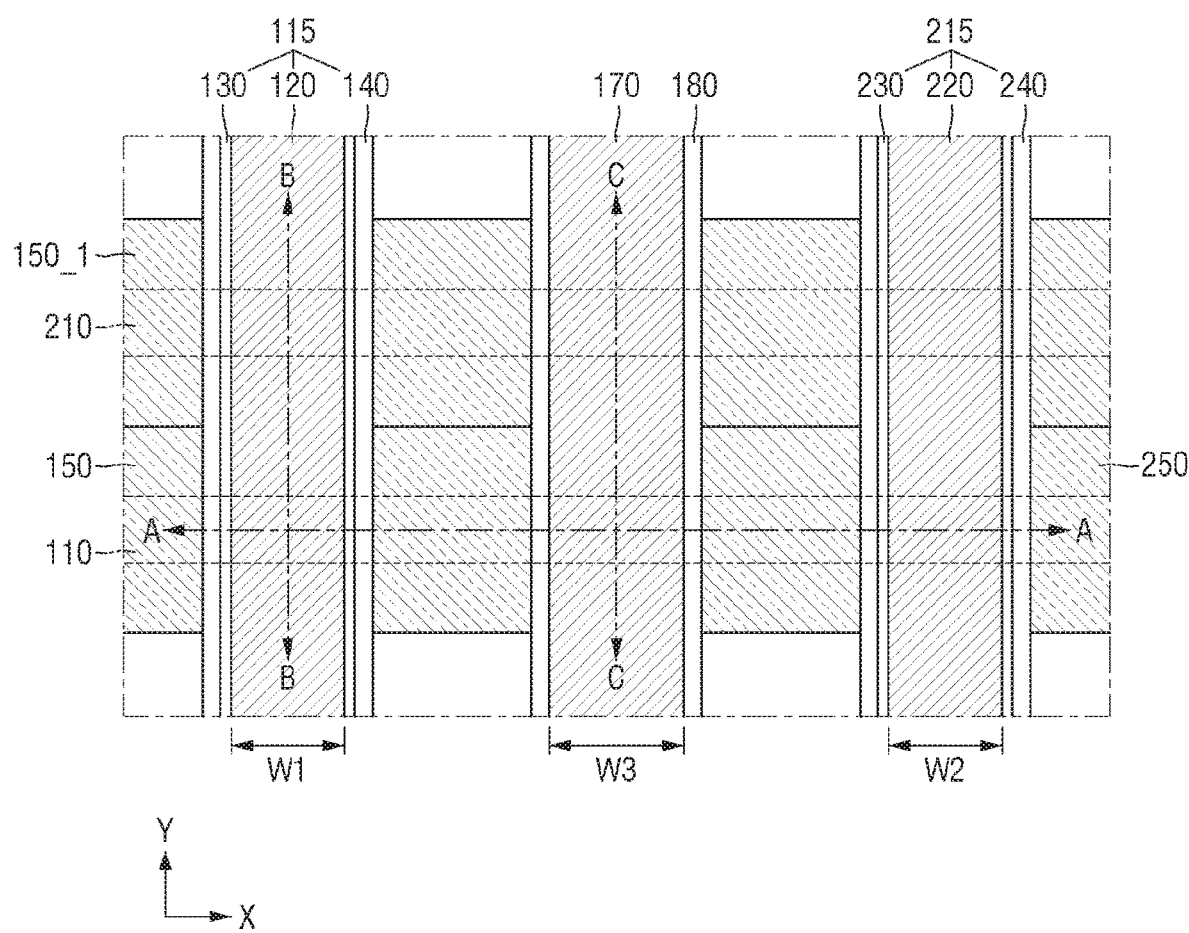
FIG. 1 is a plan view illustrating a semiconductor device according to some example embodiments.
Figure 2A:
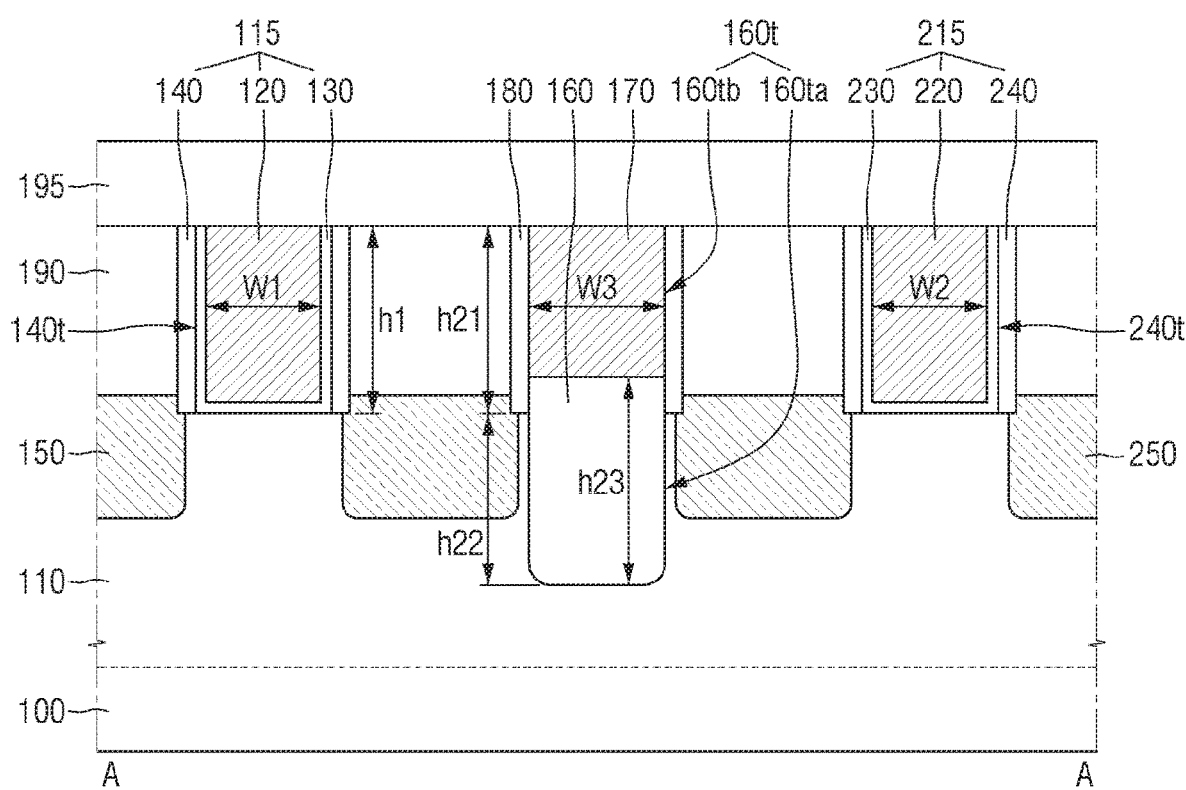
FIGS. 2A and 2B are cross-sectional views taken along line A-A of FIG. 1, illustrating a semiconductor device according to some example embodiments.
Figure 2B:
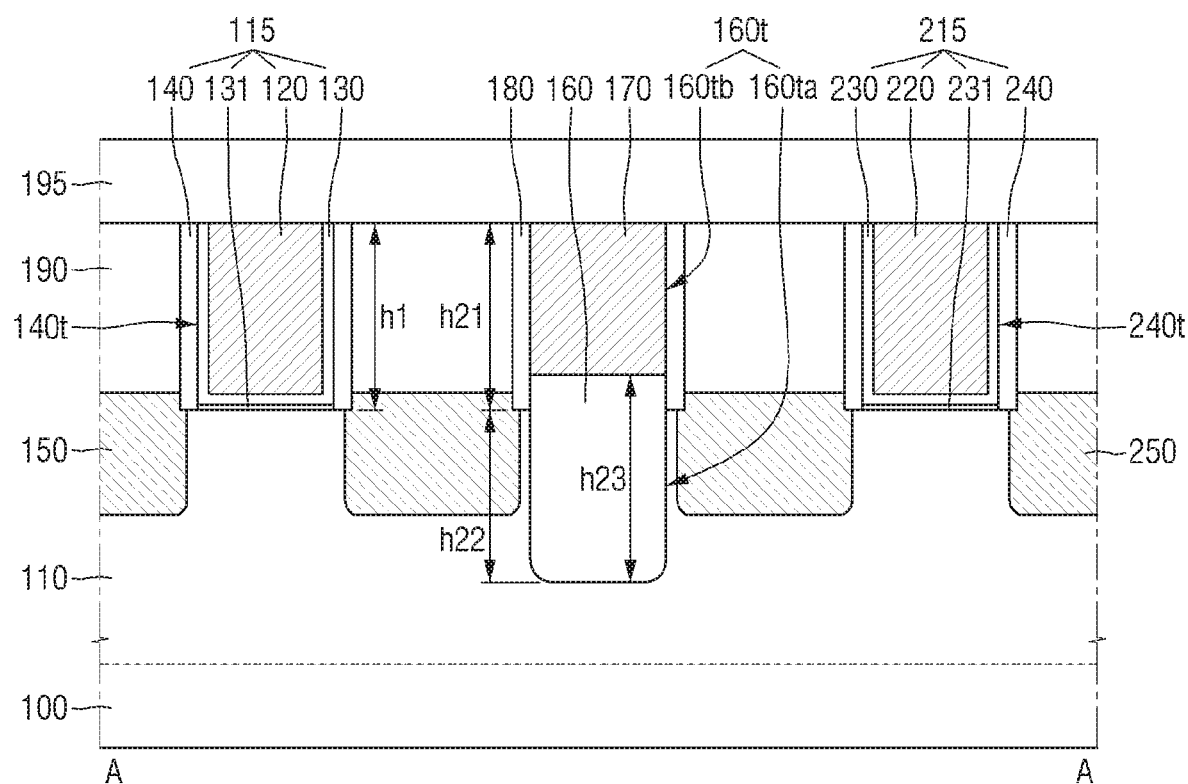
Figure 3:
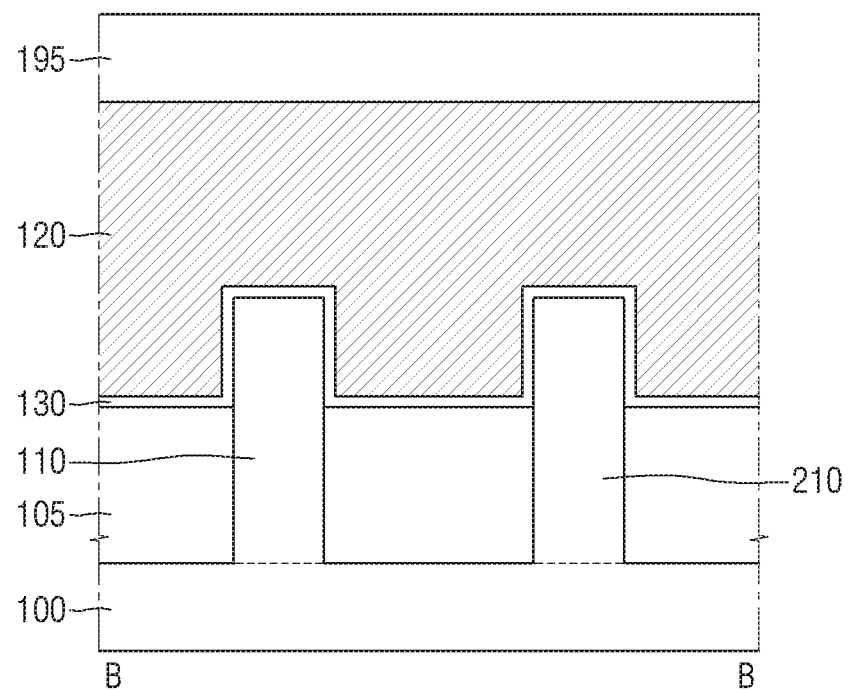
FIG. 3 is a cross-sectional view taken along line B-B of FIG. 1, illustrating a semiconductor device according to some example embodiments.
Figure 4:
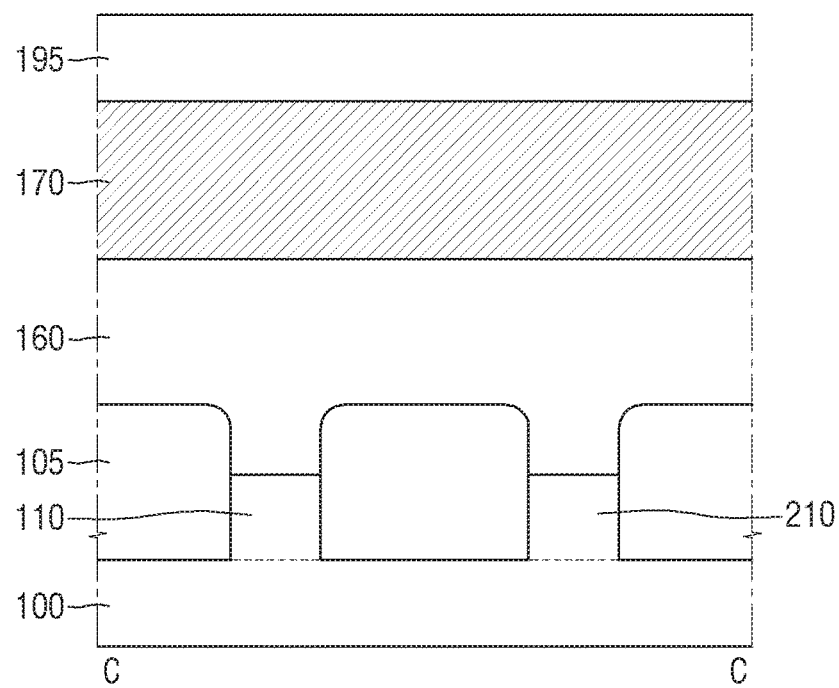
FIG. 4 is a cross-sectional view taken along line C-C of FIG. 1, illustrating a semiconductor device according to some example embodiments.

FIG. 1 is a plan view illustrating a semiconductor device according to some example embodiments. FIGS. 2A and 2B are cross-sectional views taken along line A-A of FIG. 1, illustrating a semiconductor device according to some example embodiments. FIG. 3 is a cross-sectional view taken along line B-B of FIG. 1, illustrating a semiconductor device according to some example embodiments. FIG. 4 is a cross-sectional view taken along line C-C of FIG. 1, illustrating a semiconductor device according to some example embodiments.

Referring to FIGS. 1, 2A, 2B, 3, and 4, a semiconductor device may include a first fin-type pattern 110, a second fin-type pattern 210, a first gate structure 115, a second gate structure 215, a device isolation layer 160, a connection conductive pattern 170, dummy spacers 180, a first epitaxial pattern 150, and a second epitaxial pattern 250.

A substrate 100 may include bulk silicon substrate or silicon-on-insulator (SOI), or may include another material such as silicon germanium, silicon germanium on insulator (SGOI), indium antimonide, lead telluride, indium arsenide, indium phosphide, gallium arsenide, or gallium antimonide, but inventive concepts are not limited thereto.

The first fin-type pattern 110 and the second fin-type pattern 210 may extend in a first direction X, on a substrate 100. The first fin-type pattern 110 and second fin-type pattern 210 may protrude from the substrate 100.

The first fin-type pattern 110 and second fin-type pattern 210 may be adjacent and parallel to each other. The first fin-type pattern 110 and second fin-type pattern 210 may be arranged in a second direction Y crossing the first direction X. For example, the first fin-type pattern 110 and second fin-type pattern 210 may each include a long side extending in the first direction X and a short side extending in the second direction Y. The long side of the first fin-type pattern 110 may face the long side of the second fin-type pattern 210.

The first fin-type pattern 110 and second fin-type pattern 210 may be or include a portion of the substrate 100 and may each include an epitaxial layer grown from the substrate 100.

The first fin-type pattern 110 and second fin-type pattern 210 may include a semiconductor material, for example, silicon or germanium. The first fin-type pattern 110 and second fin-type pattern 210 may each include a compound semiconductor, for example, a group IV-IV compound semiconductor or a group compound semiconductor. In example embodiments, the group IV-IV compound semiconductor, for example, a binary compound or a ternary compound including at least two elements of carbon (C), silicon (Si), germanium (Ge), and tin (Sn), or a compound doped with a group IV element. The group III-V compound semiconductor may include, for example, a binary compound, a ternary compound or a quaternary compound, prepared by combining at least one group III element of aluminum (Al), gallium (Ga) and indium (In) with at least one group V element of phosphorus (P), arsenic (As) and antimony (Sb).

In the semiconductor device according to some example embodiments, the first fin-type pattern HO and second fin-type pattern 210 are assumed to be silicon fin-type patterns including silicon.

In the semiconductor device of FIGS. 1 to 4, the first fin-type pattern 110 and second fin-type pattern 210 may include a channel region of the same conductivity type.

A field insulating layer 105 may be formed on the substrate 100. The field insulating layer 105 may be between the first fin-type pattern 110 and the second fin-type pattern 210.

The field insulating layer 105 may cover a portion of the first fin-type pattern 110 and a portion of the second fin-type pattern 210. The field insulating layer 105 may cover a portion of a sidewall of the first fin-type pattern 110 and a portion of a sidewall of the second fin-type pattern 210.

An upper surface of the first fin-type pattern 110 and an upper surface of the second fin-type pattern 210 may protrude above the field insulating layer 105 between the long sides of the first fin-type pattern 110 and second fin-type pattern 210. The first fin-type pattern 110 and second fin-type pattern 210 may each be defined by the field insulating layer 105.

The field insulating layer 105 may include, for example, silicon oxide, silicon nitride, and/or silicon oxynitride; however, inventive concepts are not limited thereto.

The field insulating layer 105 may further include at least one field liner layer between the first fin-type pattern 110 and field insulating layer 105 and between the second fin-type pattern 210 and the field insulating layer 105. The field liner layer may include, for example, polysilicon, amorphous silicon, silicon oxynitride, silicon nitride, and/or silicon oxide; however, inventive concepts are not limited thereto.

The first gate structure 115 and the second gate structure 215 may each extend in the second direction Y. The first gate structure 115 and second gate structure 215 may be on the first fin-type pattern 110 and second fin-type pattern 210 and may cross the first fin-type pattern 110 and second fin-type pattern 210. The first gate structure 115 and second gate structure 215 may be spaced apart from each other in the first direction X.

Referring to FIG. 2A, the first gate structure 115 may include a first gate electrode 120, a first gate insulating layer 130, first gate spacers 140, and a first gate trench 140t defined by the first gate spacers 140.

The second gate structure 215 may include a second gate electrode 220, a second gate insulating layer 230, second gate spacers 240, and a second gate trench 240t defined by the second gate spacers 240.

Referring to FIG. 2B, the first gate structure 115 may further include a first interfacial layer 131, in addition to the elements of the first gate structure 115 shown in FIG. 2A. The second gate structure 215 may further include a second interfacial layer 231, in addition to the elements of the second gate structure 215 shown in FIG. 2A.

The first gate electrode 120 and the second gate electrode 220 may be formed on the first fin-type pattern 110, the field insulating layer 105, and the second fin-type pattern 210.

The first gate electrode 120 and second gate electrode 220 may cover the first fin-type pattern 110 and second fin-type pattern 210 protruding above the field insulating layer 105. The first gate electrode 120 may fill at least a portion of the first gate trench 140t. The second gate electrode 220 may fill at least a portion of the second gate trench 240t.

The first gate electrode 120 and second gate electrode 220 may include, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum t), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (In), palladium (Pd), iridium (Ir), osmium (Os), silver (Ag), gold (Au), zinc (Zn), vanadium (V), and/or a combination thereof.

The first gate electrode 120 and second gate electrode 220 may be formed by, for example, a replacement process (or a gate last process), but inventive concepts are not limited thereto.

Although the first gate electrode 120 and second gate electrode 220 each are illustrated in a single layer, in FIGS. 1 to 3, inventive concepts are not limited thereto. For example, the first gate electrode 120 and second gate electrode 220 may each include a laminated structure in which different material layers are stacked.

The first gate spacers 140 may be formed on sidewalls of the first gate electrode 120. The second gate spacers 240 may be formed on sidewalls of the second gate electrode 220. The first gate spacer 140 and second gate spacer 240 may include, for example, silicon nitride, silicon oxynitride, silicon oxide, silicon oxycarbonitride, and/or a combination thereof.

Referring to FIGS. 2A and 2B, the first gate insulating layer 130 may be formed between the first fin-type pattern 110 and the first gate electrode 120 and between the second fin-type pattern 210 and the first gate electrode 120. The first gate insulating layer 130 may conformally extend along surfaces of the first fin-type pattern 110 and second fin-type pattern 210 protruding above the field insulating layer 105.

The first gate insulating layer 130 may be formed along an inner surface, e.g., sidewalls and a bottom surface, of the first gate trench 140t. The first gate insulating layer 130 may be between the first gate spacers 140 and the first gate electrode 120. The first gate electrode 120 may be formed on the first gate insulating layer 130.

The second gate insulating layer 230 may be formed between the first fin-type pattern 110 and the second gate electrode 220 and between the second fin-type pattern 210 and the second gate electrode 220. The second gate insulating layer 230 may conformally extend along the surfaces of the first fin-type pattern 110 and second fin-type pattern 210 protruding above the field insulating layer 105.

The second gate insulating layer 230 may be formed along an inner surface (e.g., sidewalls and a bottom surface) of the second gate trench 240t. The second gate insulating layer 230 may be between the second gate spacers 240 and the second gate electrode 220. The second gate electrode 220 may be formed on the second gate insulating layer 230.

Referring to FIG. 2B, the first interfacial layer 131 may be formed between the first gate insulating layer 130 and the first fin-type pattern 110, and the second interfacial layer 231 may be formed between the second gate insulating layer 230 and the first fin-type pattern 110. The first interfacial layer 131 and second interfacial layer 231 may include, for example, silicon oxide, but inventive concepts are not limited thereto. A material forming the first interfacial layer 131 and second interfacial layer 231 may vary depending on the material included in the first fin-type pattern 110.

Hereinafter, descriptions will be with reference to FIG. 2A, not illustrating the first interfacial layer 131 and second interfacial layer 231.

The first gate insulating layer 130 and second gate insulating layer 230 may include, for example, a high-k dielectric material having a dielectric constant greater than silicon oxide. The first gate insulating layer 130 and second gate insulating layer 230 may each be a high-k dielectric insulating layer. For example, the first gate insulating layer 130 may be or may include a first high-k dielectric gate insulating layer, and the second gate insulating layer 230 may be or may include a second high-k dielectric gate insulating layer.

For example, the first gate insulating layer 130 and second gate insulating layer 230 may include, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and/or a combination thereof.

The first epitaxial pattern 150 may be formed at opposite sides of the first gate structure 115. The second epitaxial pattern 250 may be formed at opposite sides of the second gate structure 215. The first epitaxial pattern 150 and second epitaxial pattern 250 may be formed on the first fin-type pattern 110. The first epitaxial pattern 150 and second epitaxial pattern 250 may be spaced apart from each other.

The first epitaxial pattern 150 and second epitaxial pattern 250 may each be included in source/drains of a transistor, the transistor having the first fin-type pattern 110 as a channel region. The first epitaxial pattern 150 and second epitaxial pattern 250 may each be a semiconductor pattern. The first epitaxial pattern 150 and second epitaxial pattern 250 may be formed with a chemical vapor deposition process, for example, with a plasma-enhanced chemical vapor deposition (PECVD) process; however, inventive concepts are not limited thereto.

In some embodiments, when the first fin-type pattern 110 includes a channel region of a PMOS transistor, the first epitaxial pattern 150 and second epitaxial pattern 250 may include a compressive stress material. For example, the compressive material may include a material having a lattice constant greater than silicon (Si), for example, silicon germanium (SiGe). The compressive stress material apply compressive stress to the first fin-type pattern 110, thereby increasing mobility of the channel region, for example, increasing hole mobility in the channel region.

In some embodiments, when the first fin-type pattern 110 includes a channel region of an NMOS transistor, the first epitaxial pattern 150 and second epitaxial pattern 250 may include a tensile stress material. For example, when the first fin-type pattern 110 is formed of silicon (Si), the first epitaxial pattern 150 and second epitaxial pattern 250 may include a material having a lattice constant less than silicon, for example, silicon carbide (SiC). The tensile stress material apply tensile stress to the first fin-type pattern 110, thereby increasing mobility of the channel region, for example, increasing electron mobility in the channel region. In some embodiments, when the first epitaxial pattern 150 and second epitaxial pattern 250 is formed of silicon, the first epitaxial pattern 150 and second epitaxial pattern 250 may each be a silicon epitaxial pattern.

Although the first epitaxial pattern 150 on the first fin-type pattern 110 and a first-first epitaxial pattern 150_1 on the second fin-type pattern 210 are in contact with each other, as illustrated in FIG. 1, inventive concepts are not limited thereto.

The dummy spacers 180 (e.g., a pair of dummy spacers 180) may be between one of the first gate spacers 140 and one of the second gate spacers 240 that face each other. The dummy spacers 180 may be on the first fin-type pattern 110 and second fin-type pattern 210 and may cross the first fin-type pattern 110 and second fin-type pattern 210.

For example, the first epitaxial pattern 150 may be between one of the first gate spacers 140 and one of the dummy spacers 180 that face each other. The second epitaxial pattern 250 may be between one of the second gate spacers 240 and another of the dummy spacers 180 that face each other.

The dummy spacers 180 may be formed at the same level as the first gate spacers 140 and second gate spacers 240. As used herein, the term "formed at the same level" means formation by a same manufacturing process. The dummy spacers 180 and the first gate spacers 140 and the second gate spacers 240 may be formed with a chemical vapor deposition (CVD) process, such as a low pressure chemical vapor deposition (LPCVD) process; however, inventive concepts are not limited The dummy spacers 180 may include the same material as the first gate spacer 140 and second gate spacer 240. When the first gate spacer 140 and second gate spacer 240 include the laminated structure, the dummy spacers 180 may also include the same laminated structure as the first gate spacer 140 and second gate spacer 240.

In some embodiments, a height h21 from the upper surface of the first fin-type pattern 110 to an upper surface of at least one of the dummy spacers 180 may be equal, or substantially equal, to a height hl from the upper surface of the first fin-type pattern 110 to an upper surface of at least one of the first gate spacers 140.

A separation trench 160t may be formed between a pair of dummy spacers 180. The separation trench 160t may include sidewalls defined by the first fin-type pattern 110 and the dummy spacers 180. The sidewalls of the separation trench 160t may be defined by the first fin-type pattern 110 and the dummy spacers 180

The separation trench 160t may be formed between the first epitaxial pattern 150 and the second epitaxial pattern 250.

In some embodiments, a depth h22 from the upper surface of the first fin-type pattern 110 to a bottom surface of the separation trench 160t may be greater than a depth h23 from the upper surface of the first fin-type pattern 110 to a lower surface of the first epitaxial pattern 150. A height h22 from the bottom surface of the separation trench 160t to the upper surface of the first fin-type pattern 110 may be less than a height of the first fin-type pattern 110, which extends from the upper surface of the substrate 100 to the upper surface of the first fin-type pattern 110. For example, the separation trench 160t may be formed by removing a portion of the first fin-type pattern 110.

FIGS. 2A and 2B, illustrate that the separation trench 160t in the first fin-type pattern 110 has a constant width, but inventive concepts are not limited thereto.

The separation trench 160t may include a lower portion 160ta and an upper portion 160tb. For example, sidewalls of the lower portion 160ta of the separation trench 160t may be defined by a portion of the dummy spacers 180 and the first fin-type pattern 110, and a sidewall of the upper portion 160tb of the separation trench 160t may be defined by the dummy spacers 180.

A portion of the sidewalls of the separation trench 160t defined by the dummy spacers 180 and another portion thereof defined by first fin-type pattern 110 may be aligned with each other. For example, when the upper surface of the first fin-type is assumed as a boundary line, a width of the separation trench 160t defined by the dummy spacers 180 on the boundary line may be equal, or substantially equal, to a width of the separation trench 160t defined by the first fin-type pattern 110 on the boundary line.

In the process of forming the separation trench 160t, the sidewalls of the separation trench 160t defined by the first fin-type pattern 110 may be self-aligned with sidewalls of the dummy spacers 180 defining the separation trench 160t.

The device isolation layer 160 may be formed within the separation trench 160t. The device isolation layer 160 may fill a portion of the separation trench 160t. The device isolation layer 160 may be on a portion of the sidewalls of the separation trench 160t defined by the dummy spacers 180 and the first fin-type pattern 110. The device isolation layer 160 may contact the first fin-type pattern 110.

The device isolation layer 160 may be in the lower portion 160ta of the separation trench 160t but not in the upper portion 160tb thereof. The device isolation layer 160 may fill the lower portion 160ta of the separation trench 160t.

The device isolation layer 160 may be spaced apart from the first epitaxial pattern 150 and second epitaxial pattern 250. A portion of the first fin-type pattern 110 may be between the first epitaxial pattern 150 and the device isolation layer 160 and between the second epitaxial pattern 250 and the device isolation layer 160.

In some embodiments, the device isolation layer 160 may protrude above the upper surface of the first fin-type pattern 110. The upper surface of the device isolation layer 160 may be higher than the upper surface of the first fin-type pattern 110 with respect to the upper surface of the substrate 100. For example, the height h22 from a lower surface of the device isolation layer 160 to the upper surface of the first fin-type pattern 110 may be less than a height h23 (from the bottom surface to the upper surface) of the device isolation layer 160.

When the upper surface of the first fin-type is assumed as the boundary line, a width of the device isolation layer 160 between the dummy spacers 180 on the boundary line may be equal, or substantially equal, to a width of the device isolation layer 160 in the first fin-type pattern 110 on the boundary line.

A vertical distance from the upper surface of the first fin-type pattern 110 to the lower surface of the first epitaxial pattern 150 may be less than a vertical distance, e.g. the height h22, from the upper surface of the first fin-type pattern 110 to the lower surface of the device isolation layer 160.

The device isolation layer 160 may include, for example, silicon nitride, silicon oxide, silicon carbide, silicon oxycarbide, silicon oxynitride, silicon oxycarbonitride, and/or a combination thereof.

The connection conductive pattern 170 may be on the device isolation layer 160. The connection conductive pattern 170 may be in the separation trench 160t. The connection conductive pattern 170 may fill the upper portion 160tb of the separation trench 160t left unfilled by the device isolation layer 160.

The connection conductive pattern 170 may contact the sidewalls of the dummy spacers 180 and the upper surface of the device isolation layer 160.

The dielectric insulating layer may not be formed between the connection conductive pattern 170 and the dummy spacers 180 and between the device isolation layer 160 and the connection conductive pattern 170. Alternatively, the first gate insulating layer 130 and the second gate insulating layer 230 that include the high-k dielectric insulating material may be formed between the first gate electrode 120 and the first gate spacers 140 and between the second gate electrode 220 and the second gate spacers 240, respectively. In some example embodiments, the high-k dielectric insulating material included in the first gate insulating layer 130 and second gate insulating layer 230 may not be between the connection conductive pattern 170 and the dummy spacers 180 and between the connection conductive pattern 170 and the device isolation layer 160. The high-k dielectric insulating layer may not be formed along the sidewalls of the dummy spacers 180 and the upper surface of the device isolation layer 160.

A width in the first direction X between the first gate spacers 140 and a width in the first direction X between the second gate spacers 240 may each be equal, or substantially equal, to a width in the first direction X between the dummy spacers 180. As used herein, the term "substantially equal width" means an exactly identical width or a nearly identical width within acceptable variations that may occur, for example, due to manufacturing processes.

The first gate insulating layer 130 and the second gate insulating layer 230 may be between the first gate spacers 140 and the first gate electrode 120 and between the second gate spacers 240 and the second gate electrode 220, respectively. However, the connection conductive pattern 170 may contact the dummy spacers 180. Thus, a width W1 of the first gate electrode 120 in the first direction X and a width W2 of the second gate electrode 220 in the first direction X may each be different from a width W3 of the connection conductive pattern 170 in the first direction X. For example, the width W1 of the first gate electrode 120 and the width W2 of the second gate electrode 220 may each be less than the width W3 of the connection conductive pattern 170.

The connection conductive pattern 170 may include at least ogre of the conductive materials included in the first gate electrode 120, described above.

In an embodiment, the connection conductive pattern 170 may include a laminated structure in which different material layers are stacked.

For example, the connection conductive pattern 170 may be used as an interconnection line for connecting gate electrodes of transistors arranged in the second direction Y, but inventive concepts are not limited thereto. Descriptions thereto will be made with reference to FIG. 12.

The lower interlayer insulating layer 190 may be formed on the first epitaxial pattern 150 and the second epitaxial pattern 250. The lower interlayer insulating layer 190 may cover sidewalls of the first gate structure 115, sidewalls of the second gate structure 215, and the sidewalls of the dummy spacers 180. An upper surface of the lower interlayer insulating layer 190 may be coplanar with an upper surface of the first gate electrode 120, an upper surface of the second gate electrode 220, and an upper surface of the connection conductive pattern 170.

The upper interlayer insulating layer 195 may be formed on the lower interlayer insulating layer 190, the first gate structure 115, the second gate structure 215, and the connection conductive pattern 170.

The lower and upper interlayer insulating layers 190 and 195 may include, for example, silicon oxide, silicon nitride, silicon oxynitride, Flowable Oxide (FOX©), Tonen SilaZene (TOSZ), Undoped. Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), PARYLENE, bis-benzocyclobutenes (BCB), SiLK, polyimide, porous polymeric material, and/or a combination thereof.

Figure 5:
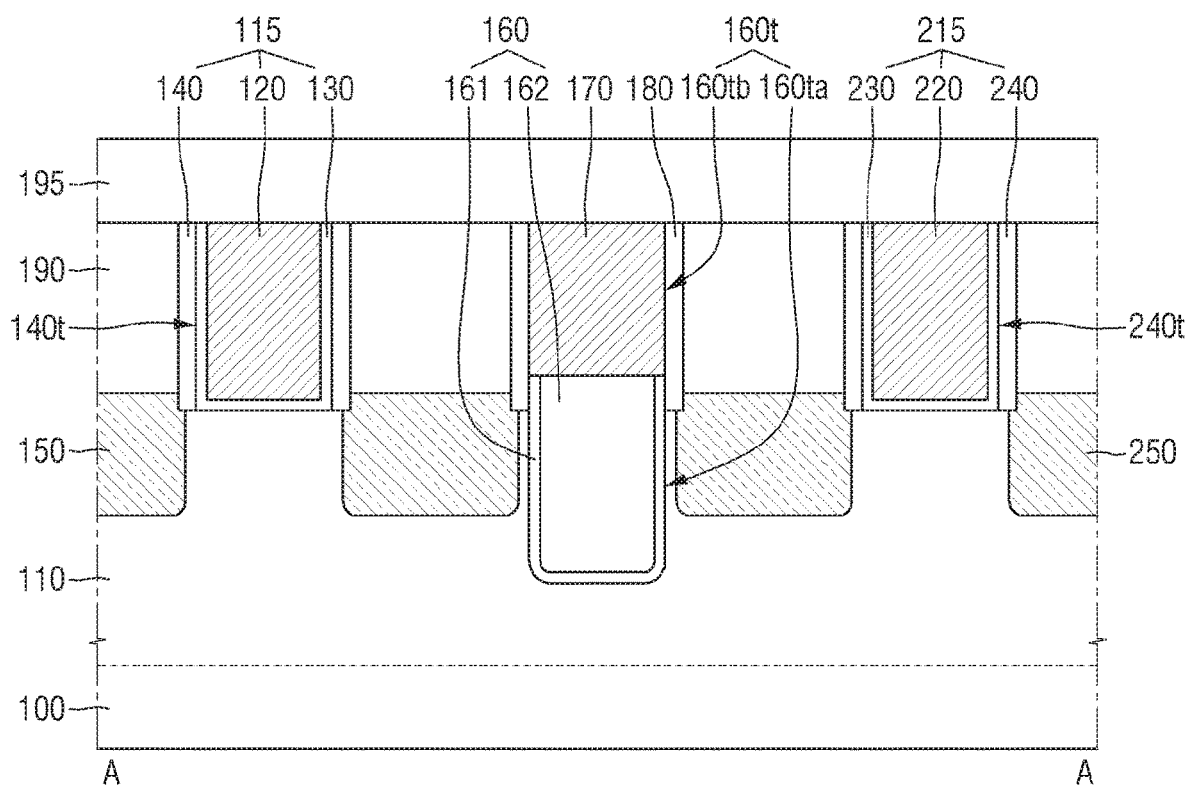
FIGS. 5, 6, 7, 8, 9, 10, and 11 respectively illustrate a semiconductor device according to some example embodiments.

FIG. 5 illustrates a semiconductor device according to some example embodiments.

Referring to FIG. 5, in the semiconductor device according to some example embodiments, the device isolation layer 160 may include an insulating liner 161 and a filling insulating layer 162.

The insulating liner 161 may extend along an inner surface of the separation trench 160t. The insulating liner 161 may extend along the inner surface of the lower portion 160ta of the separation trench 160t. The filling insulating layer 162 may be on the insulating liner 161. The filling insulating layer 162 may fill the lower portion 160ta of the separation trench 160t having the insulating liner 161 therein.

The insulating liner 161 may include a different material from the filling insulating layer 162.

Although it is illustrated that an uppermost surface of the insulating liner 161 and an upper surface of the filling insulating layer 162 is coplanar with each other, inventive concepts are not limited thereto. Further, although it is illustrated that the insulating liner 161 conformally extends along the inner surface of the separation trench 160t, inventive concepts are not limited thereto.

Figure 6:
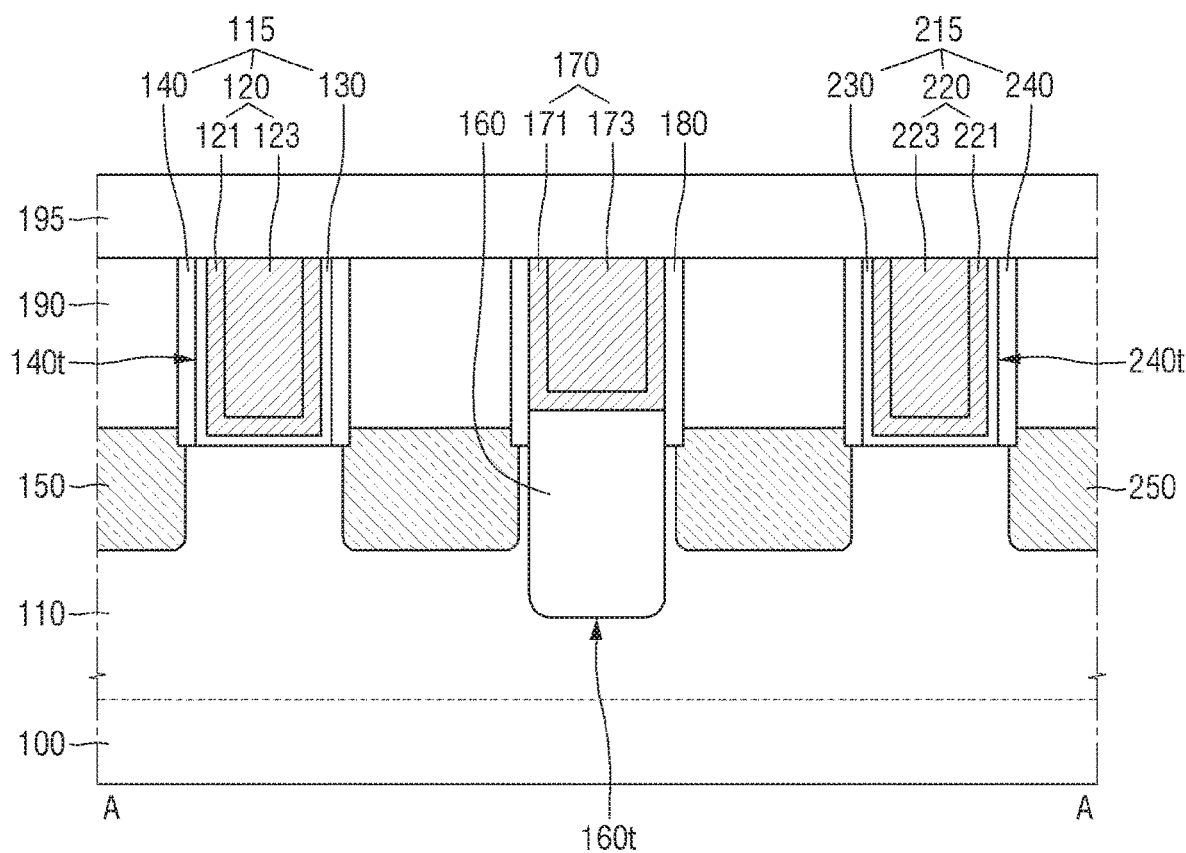

FIG. 6 illustrates a semiconductor device according to some example embodiments.

Referring to FIG. 6, in the semiconductor device according to some example embodiments, the first gate electrode 120 may include a first conductive liner layer 121 and a first filling conductive layer 123. The second gate electrode 220 may include a second conductive liner layer 221 and a second filling conductive layer 223. The connection conductive pattern 170 may include a third conductive liner layer 171 and a third filling conductive layer 173.

The first conductive liner layer 121 may be on the first gate insulating layer 130 and may extend along an inner surface of the first gate trench 140t. The first filling conductive layer 123 may be on the first conductive liner layer 121 and may fill the first gate trench 140t.

The second conductive liner layer 221 may be on the second gate insulating layer 230 and may extend along an inner surface of the second gate trench 240t. The second filling conductive layer 223 may be on the second conductive liner layer 221 and may fill the second gate trench 240t.

The third conductive liner layer 171 may be on the device isolation layer 160 and may extend along the inner surface of the separation trench 160t. The third filling conductive layer 173 may be on the third conductive liner layer 171 and may fill the separation trench 160t.

In some embodiments, each of the first conductive liner layer 121, the second conductive liner layer 221, and the third conductive liner layer 171 may include a laminated structure in which at least one conductive layer is stacked. The first conductive liner layer 121, the second conductive liner layer 221, and the third conductive liner layer 171 may include the same laminated structure. The first filling conductive layer 123, the second filling conductive layer 223, and the third filling conductive layer 173 may include the same material. The first filling conductive layer 123, the second filling conductive layer 223, and the third filling conductive layer 173 may be formed by the same manufacturing process. A width of the third filling conductive layer 173 may be greater than a width of each of the first filling conductive layer 123 and second filling conductive layer 223.

For example, when the first conductive liner layer 121 includes a structure in which a first conductive layer, a second conductive layer, and a third conductive layer may be stacked, e.g. sequentially stacked, and the third conductive liner layer 171 includes the structure in which the first conductive layer, the second conductive layer, and the third conductive layer may be stacked, e.g. sequentially stacked, the first conductive liner layer 121 and the third conductive liner layer 171 may include the same laminated structure.

In other embodiments, each of the first conductive liner layer 121, the second conductive liner layer 221, and the third conductive liner layer 171 may include a laminated structure in which at least one conductive layer is stacked. The first conductive liner layer 121 and the second conductive liner layer 221 may include the same laminated structure, but the first conductive liner layer 121 and the third conductive liner layer 171 may include different laminated structures. The first filling conductive layer 123 and the second filling conductive layer 223 may include the same material, but the first filling conductive layer 123 and the third filling conductive layer 173 may include different materials. The width of the third filling conductive layer 173 may be equal to or different from the width of the first filling conductive layer 123.

Figure 7:
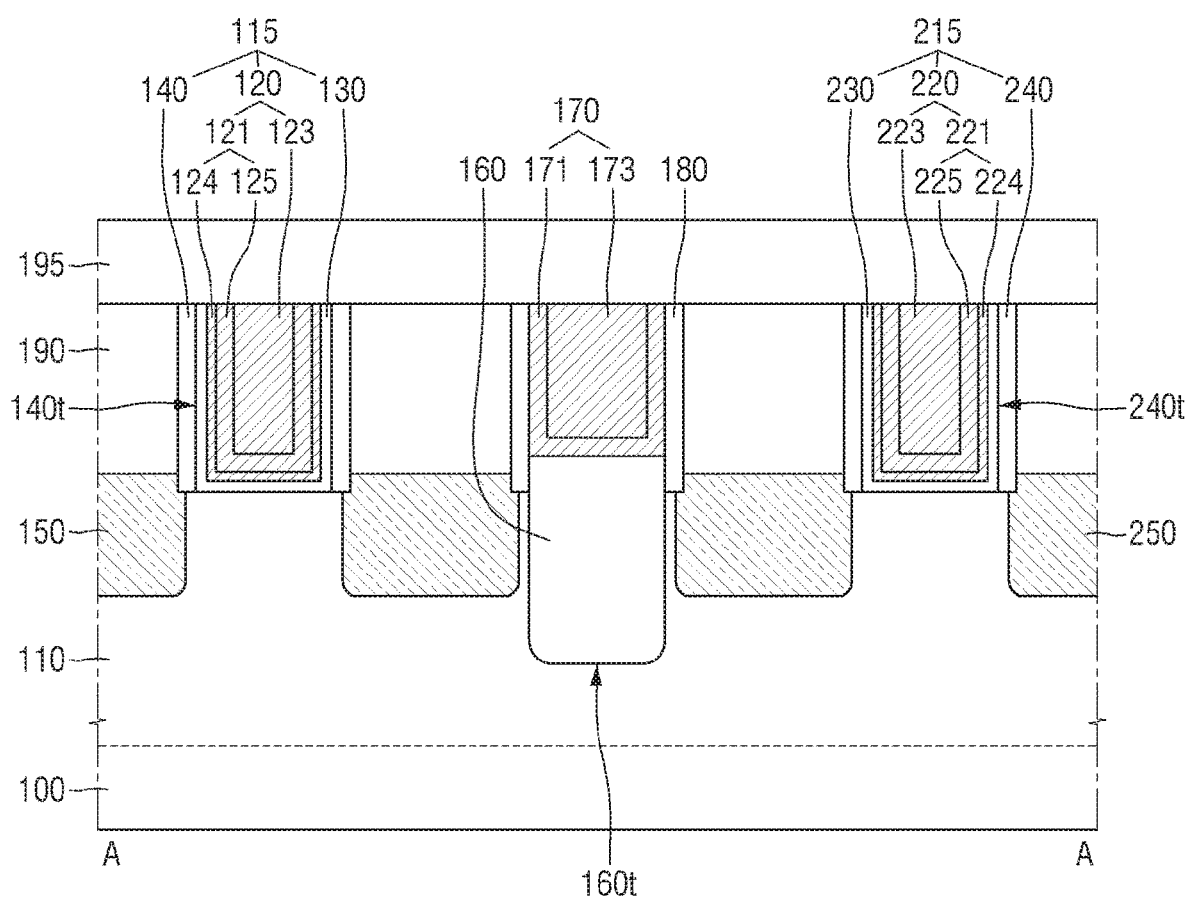

FIG. 7 illustrates a semiconductor device according to some example embodiments.

Referring to FIG. 7, in the semiconductor device according to some example embodiments, the first conductive liner layer 121 may include a first lower conductive liner layer 124 and a first upper conductive liner layer 125. The second conductive liner layer 221 may include a second lower conductive liner layer 224 and a second upper conductive liner layer 225.

The first upper conductive liner layer 125 may be on the first lower conductive liner layer 124. The second upper conductive liner layer 225 may be on the second lower conductive liner layer 224.

The first lower conductive liner layer 124 may not be between the third conductive liner layer 171 and the device isolation layer 160 and between the third conductive liner layer 171 and the dummy spacers 180. The connection conductive pattern 170 may not include the first lower conductive liner layer 124.

In some embodiments, the first upper conductive liner layer 125, the second upper conductive liner layer 225, and the third conductive liner layer 171 may include the same laminated structure. The first filling conductive layer 123, the second filling conductive layer 223, and the third filling conductive layer 173 may include the same material.

In other embodiments, the first upper conductive liner layer 125 and the second upper conductive liner layer 225 may include the same laminated structure, but the first upper conductive liner layer 125 and the third conductive liner layer 171 may include different laminated structures. The first filling conductive layer 123, the second filling conductive layer 223 may include the same material, but the first filling conductive layer 123 and the third filling conductive layer 173 may include different materials.

Referring to FIGS. 6 and 7, each of the first conductive liner layer 121, the second conductive liner layer 1, and the third conductive liner layer 171 may include the laminated structure in which at least one conductive layer is stacked. The number of stacked layers included in the first gate electrode 120 and the number of stacked layers included in the second gate electrode 220 may each be greater than or equal to the number of stacked layers included in the connection conductive pattern 170.

Figure 8:
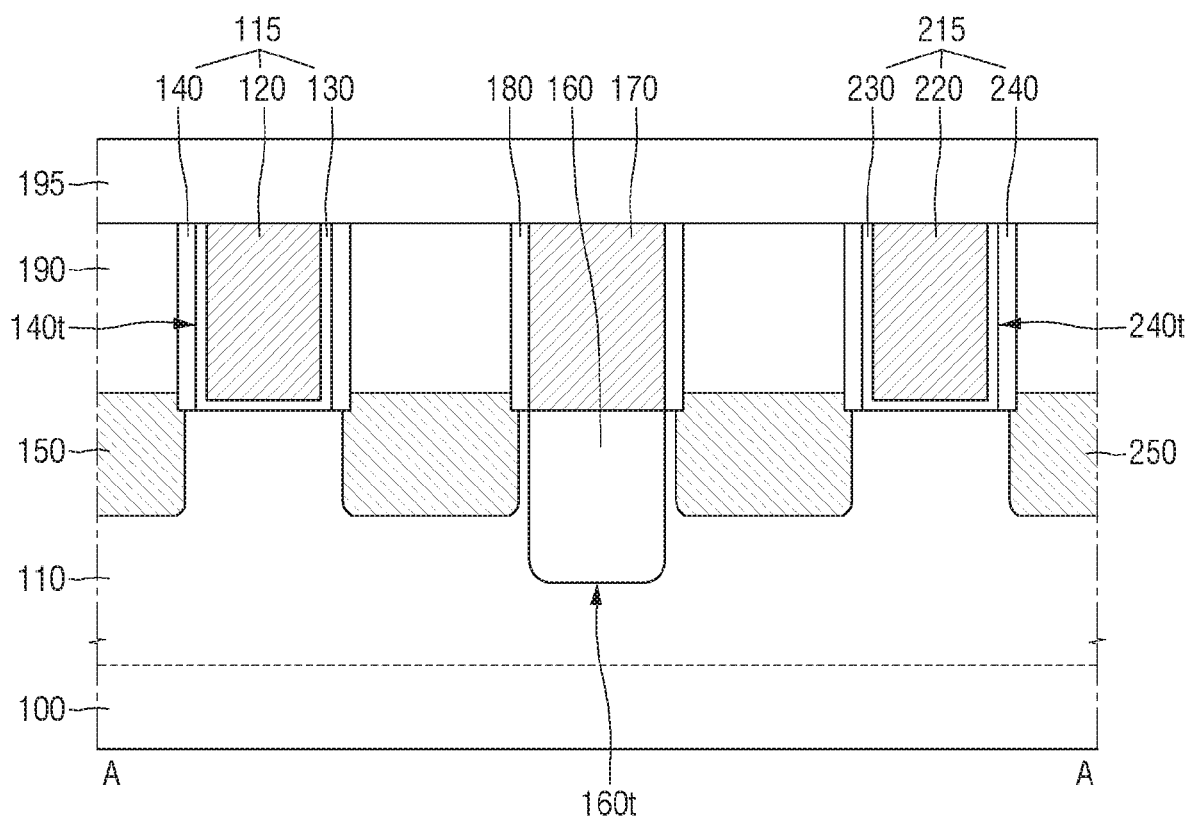
Figure 9:
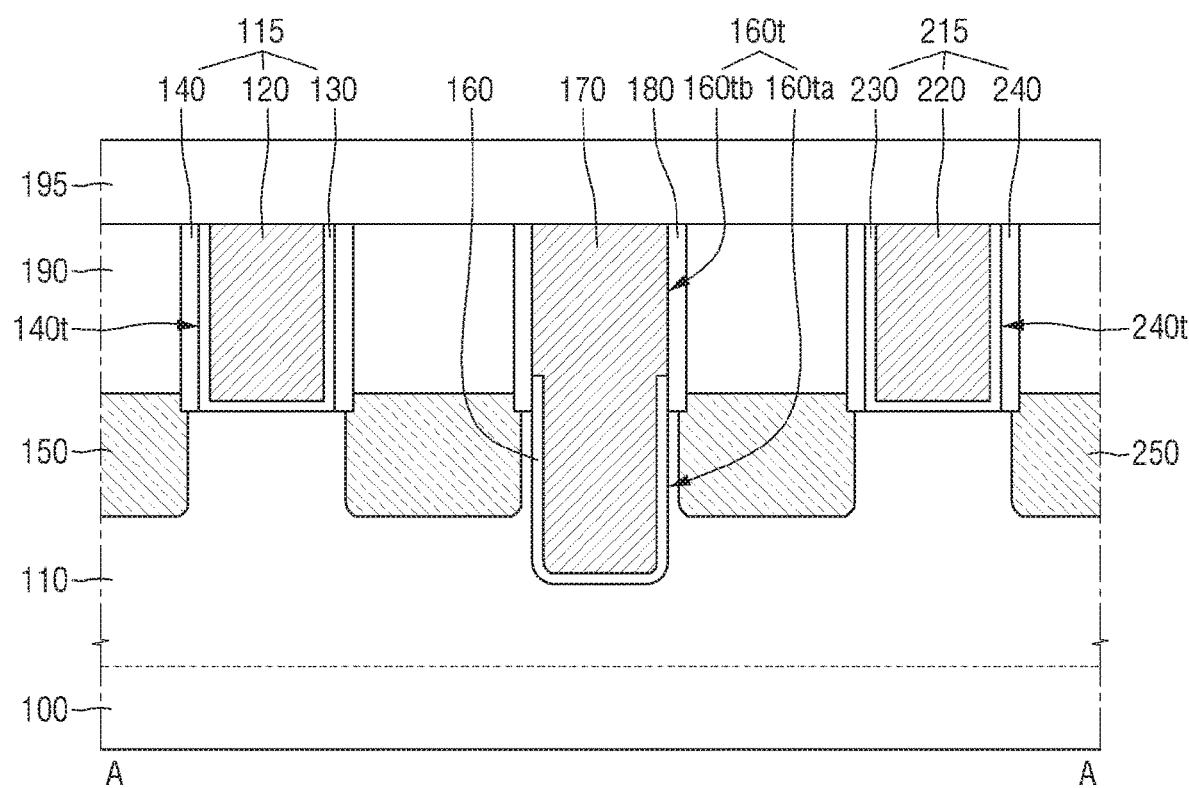
Figure 10:
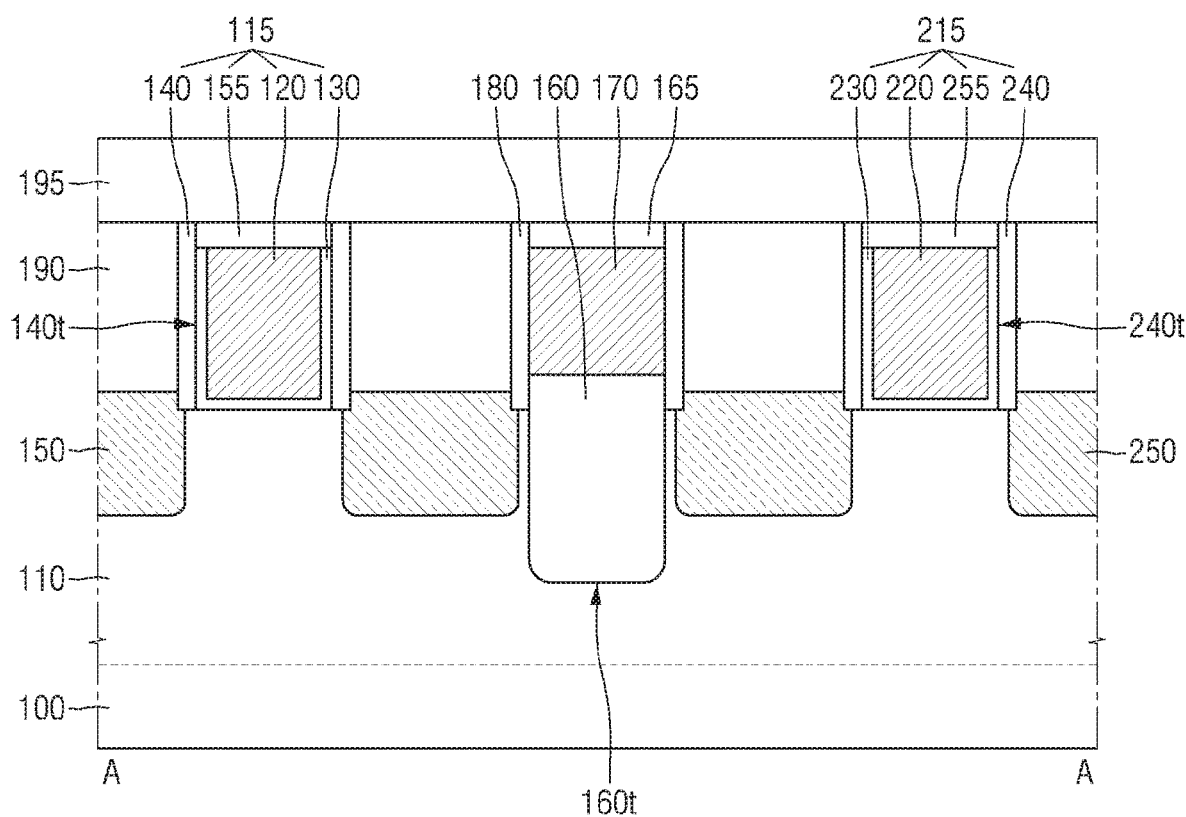
Figure 11:
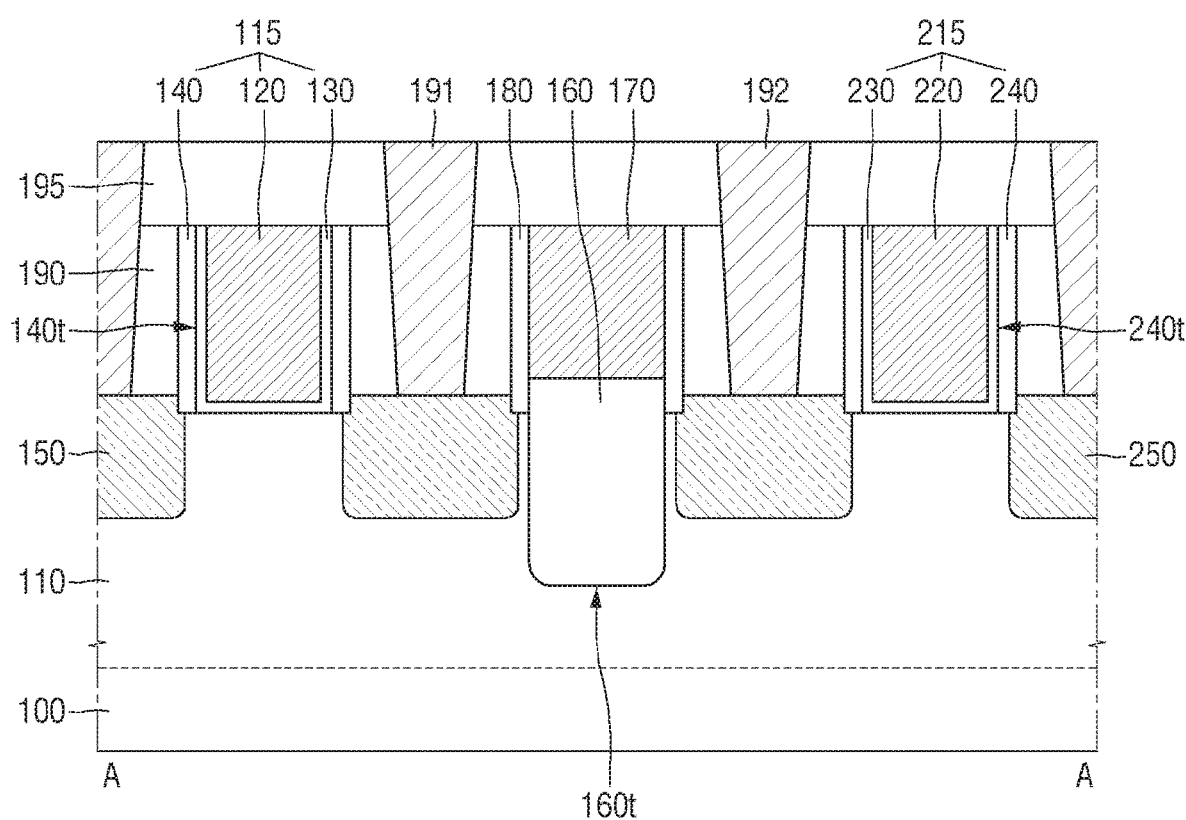

FIG. 8 illustrates a semiconductor device according to some example embodiments. FIG. 9 illustrates a semiconductor device according to some example embodiments. FIG. 10 illustrates a semiconductor device according to some example embodiments. FIG. 11 illustrates a semiconductor device according to some example embodiments.

Referring to FIG. 8, in the semiconductor according to some example embodiments, the upper surface of the first fin-type pattern 110 may be coplanar with the upper surface of the device isolation layer 160.

A height from the louver surface of the device isolation layer 160 to the upper surface of the first fin-type pattern 110 may be equal, or substantially equal, to a height of the device isolation layer 160.

Referring to FIG. 9, in the semiconductor according to some example embodiments, the device isolation layer 160 may extend along the inner surface of the lower portion 160ta of the separation trench 160t.

The device isolation layer 160 may not fully fill the lower portion 160ta of the separation trench 160t. The device isolation layer 160 may have a linear shape.

The connection conductive pattern 170 may fill the lower portion 160ta of the separation trench 160t left unfilled by the device isolation layer 160.

Referring to FIG. 10, in the semiconductor according to some example embodiments, the first gate structure 115 may further include a first capping pattern 155. The second gate structure 215 may further include a second capping pattern 255. A third capping pattern 165 may be on the connection conductive pattern 170.

The first gate electrode 120 may fill a portion of the first gate trench 140t. The first capping pattern 155 may be on the first gate electrode 120. The second gate electrode 220 may fill a portion of the second gate trench 240t. The second capping pattern 255 may be on the second gate electrode 220. The third capping pattern 165 may be in the separation trench 160t.

It is illustrated that the first gate insulating layer 130 is not between the first gate spacers 140 and the first capping pattern 155 and the second gate insulating layer 230 is not between the second gate spacers 240 and the second capping pattern 255, but inventive concepts are not limited thereto.

An upper surface of the first capping pattern 155, an upper surface of the second capping pattern 255, and an upper surface of the third capping pattern 165 may be coplanar with the upper surface of the lower interlayer insulating layer 190. The upper surface of the first capping pattern 155 and the upper surface of the second capping pattern 255 may be coplanar with an upper surface of at least one of the first gate spacers 140 and an upper surface of at least one of the second gate spacers 240, respectively. The upper surface of the third capping pattern 165 may be coplanar with an upper surface of at least one of the dummy spacers 180.

The first to third capping patterns 155, 255, and 165 may include, for example, a material having an etch selectivity to the lower interlayer insulating layer 190. The first to third capping patterns 155, 255, and 165 may include, for example, silicon nitride, silicon oxynitride, silicon oxide, silicon carbonitride, silicon oxycarbonitride, and/or a combination thereof.

Referring to FIG. 11, the semiconductor according to some example embodiments may further include a first contact 191 connected to the first epitaxial pattern 150 and a second contact 192 connected to the second epitaxial pattern 250.

The first contact 191 and second contact 192 may be in the lower and upper interlayer insulating layers 190 and 195. The first contact 191 and second contact 192 may include a conductive material.

Although not illustrated, a silicide layer may be further between the first contact 191 and the first epitaxial pattern 150 and between the second contact 192 and the second epitaxial pattern 250.

Figure 12:
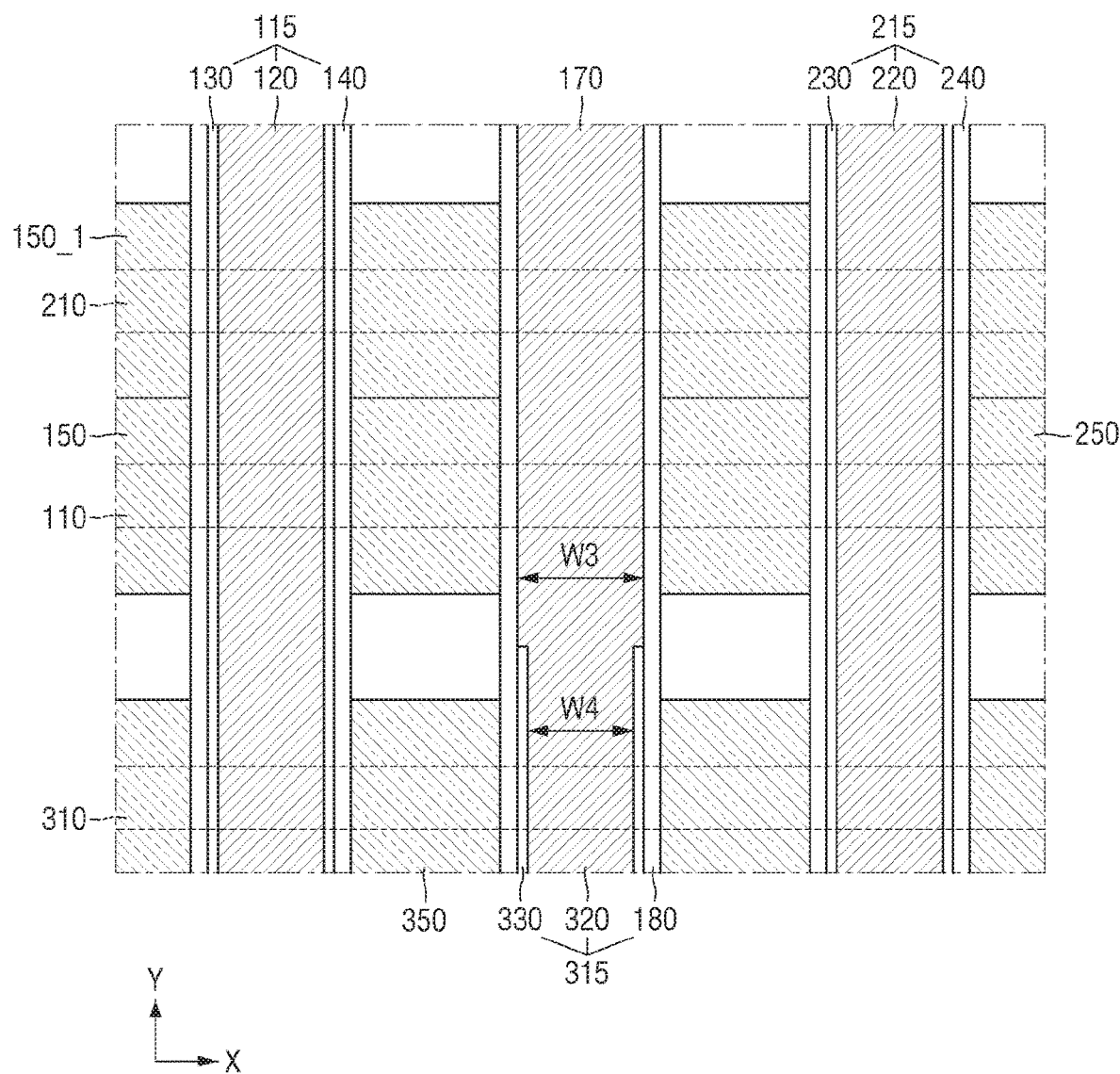
FIG. 12 is a plan view illustrating a semiconductor device according to some example embodiments.

FIG. 12 is a plan view illustrating a semiconductor device according to some example embodiments.

Referring to FIG. 12, the semiconductor according to some example embodiments may further include a third tin-type pattern 310, a third gate electrode 320, a third gate insulating layer 330, and a third epitaxial pattern 350.

The third fin-type pattern 310 may be adjacent to the first fin-type pattern 110. The third fin-type pattern 310 and the first fin-type pattern 110 may be arranged side by side. The first, second, and third fin-type patterns 110, 210, and 310 may be arranged in the second direction Y. The long side of the first fin-type pattern 110 may face a long side of the third fin-type pattern 310.

The third fin-type pattern 310 may include a material the same as or different from the first fin-type pattern 110. The third fin-type pattern 310 may be used as the channel region of the PHOS or NMOS transistor.

The third gate electrode 320 may be on the third fin-type pattern 310 and may cross the third fin-type pattern 310. The third gate electrode 320 may be between the dummy spacers 180 extending long in the second direction Y.

The third gate insulating layer 330 may be between the third gate electrode 320 and the third fin-type pattern 310. The third gate insulating layer 330 may be between the third gate electrode 320 and the dummy spacers 180. The third gate electrode 320 may be on the third gate insulating layer 330. The third gate insulating layer 330 may have a shape similar to that of the first gate insulating layer 130 of FIGS. 2A, 2B and 3.

A portion of the dummy spacers 180, the third gate electrode 320, and the third gate insulating layer 330 may form a third gate structure 315.

The third epitaxial pattern 350 may be at opposite sides of the third gate stricture 315. The third epitaxial pattern 350 may be formed on the third fin-type pattern 310. The third epitaxial pattern 350 may be included in source/drains of the transistor using the third fin-type pattern 310 as the channel region.

The third gate electrode 320 may be electrically connected to the connection conductive pattern 170. For example, in FIG. 12, a part contacting the third gate insulating layer 330 may correspond to the third gate electrode 320, and another part contacting the dummy spacers 180 and the device isolation layer 160 (refer to FIGS. 2A and 2B) may correspond to the connection conductive pattern 170.

The connection conductive pattern 170 and the third gate electrode 320 may be between the dummy spacers 180. However, the width W3 of the connection conductive pattern 170 in the first direction X may be greater than a width W4 of the third gate electrode 320 in the first direction X, due to presence or absence of the third gate insulating layer 330.

The connection conductive pattern 170 may be electrically connected to the transistor including the third gate electrode 320, the third gate insulating layer 330, and the third epitaxial pattern 350. The connection conductive pattern 170 may be used as the interconnection line connected to the gate electrode of the transistor.

In FIG. 12, the first gate electrode 120 and second gate electrode 220 are illustrated as crossing the third fin-type pattern 310. However, inventive concepts are not limited thereto. For example, at least one of the first gate electrode 120 and second gate electrode 220 may not cross the third fin-type pattern 310.

Hereinafter, a method of manufacturing a semiconductor device will be described with reference to cross-sectional views taken along line A-A of FIG. 1.

FIGS. 13 to 21 illustrate a method of manufacturing a semiconductor device.

Figure 13:
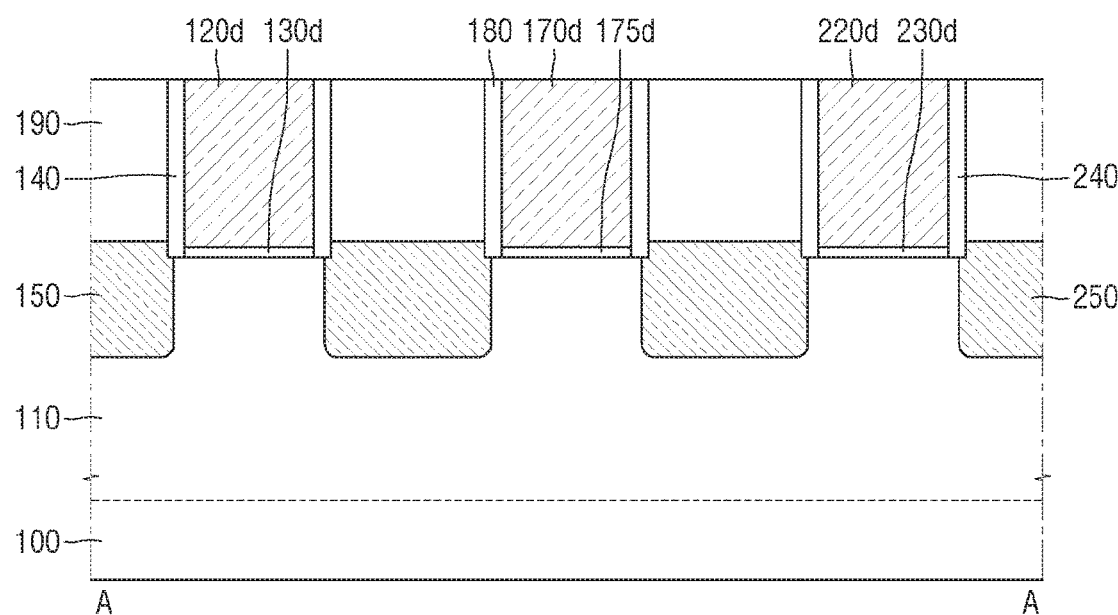
FIGS. 13 to 21 illustrate a method of manufacturing a semiconductor device according to some example embodiments.

Referring to FIG. 13, the first fin-type pattern 110 may be formed on the substrate 100 and may protrude upward from the substrate 100. A first dummy gate electrode 120d, a second dummy gate electrode 220d, and a third dummy gate electrode 170d which are spaced apart from one another may be formed on the first fin-type pattern 110 and may cross the first fin-type pattern 110. A first dummy gate insulating layer 130d, a second dummy gate insulating layer 230d, and a third dummy gate insulating layer 175d may be formed between the first dummy gate electrode 120d and the first fin-type pattern 110, between the second dummy gate electrode 220d and the first fin-type pattern 110, and between the third dummy gate electrode 170d and the first fin-type pattern 110, respectively.

The first gate spacers 140 may be formed on sidewalls of the first dummy gate electrode 120d. The second gate spacers 240 may be formed on sidewalls of the second dummy gate electrode 220d. The dummy spacers 180 may be formed on sidewalk of the third dummy gate electrode 170d.

The first epitaxial pattern 150 may be formed between the first dummy gate electrode 120d and the third dummy gate electrode 170d, The second epitaxial pattern 250 may be formed between the second dummy gate electrode 220d and the third dummy gate electrode 170d. The lower interlayer insulating layer 190 may be formed covering the first epitaxial pattern 150 and second epitaxial pattern 250 and to expose the first to third dummy gate electrodes 120d, 220d, and 170d.

Figure 14:
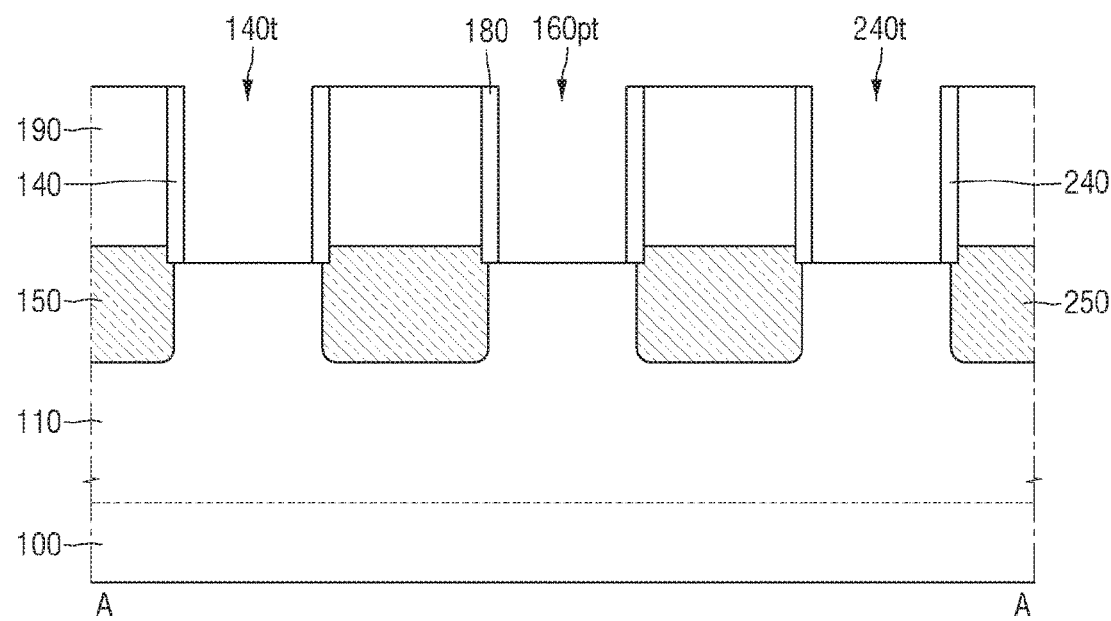

Referring to FIG. 14, the first to third dummy gate electrodes 120d, 220d, and 1170d, and the first to third dummy gate insulating layers 130d, 230d, and 175d may be removed, thereby forming the first gate trench 140t, the second gate trench 240t, and a pre-separation trench 160pt on the first fin-type pattern 110 that expose the first fin-type pattern 110. Thus, the lower interlayer insulating layer 190 may include the first gate trench 140t, the second gate trench 240t, and the pre-separation trench 160pt therein.

The pre-separation trench 160pt may be defined by the dummy spacers 180. The first gate trench 140t, the second gate trench 240t, and the pre-separation trench 160pt may be spaced apart from one another.

Figure 15:
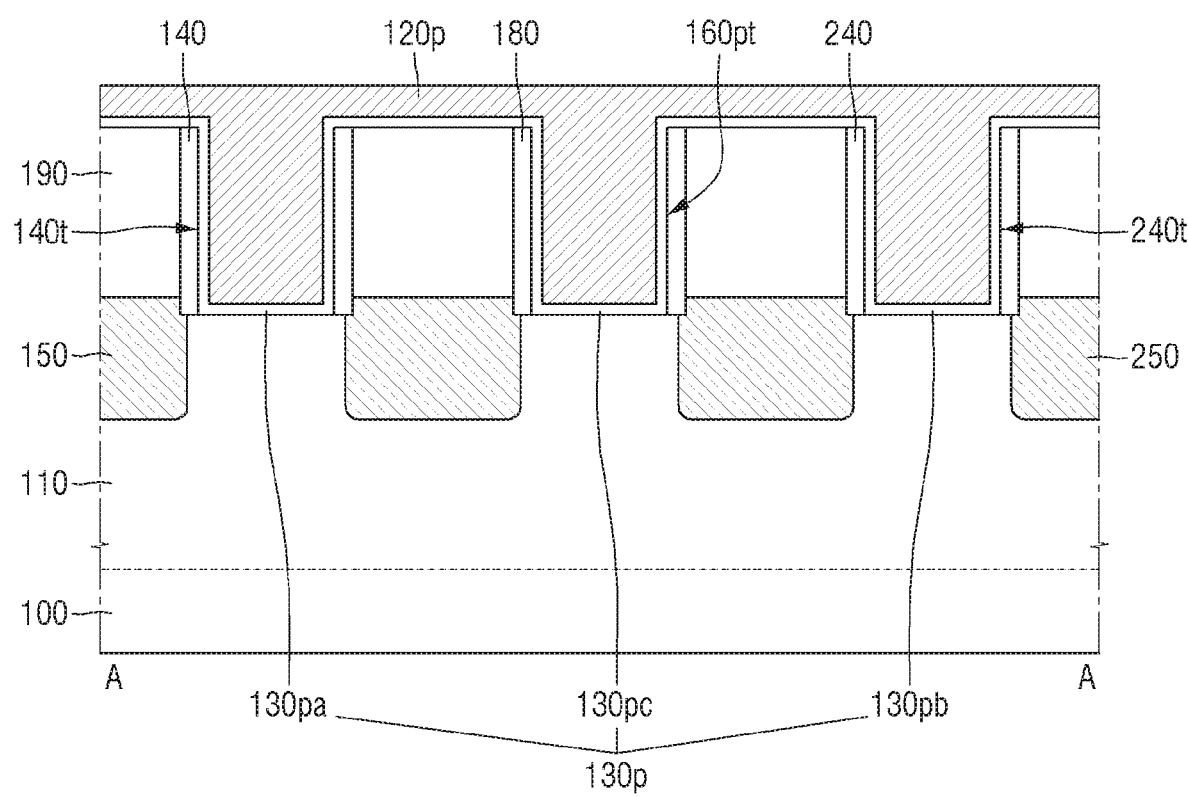

Referring to FIG. 15, a pre-high-k dielectric insulating layer 130p may be formed extending along the inner surface of the first gate trench 140t, the inner surface of the second gate trench 240t, an inner surface of the pre-separation trench 160pt, and the upper surface of the lower interlayer insulating layer 190.

The pre-high-k dielectric insulating layer 130p may include a first portion 130pa extending along the inner surface of the first gate trench 140t, a second portion 130pb extending the inner surface of the second gate trench 240t, and a third portion 130pc extending the inner surface of the pre-separation trench 160pt.

A first pre-gate electrode 120p may be formed on the pre-high-k dielectric insulating layer 130p. The first pre-gate electrode 120p may fill the first gate trench 140t, the second gate trench 240t, and the pre-separation trench 160pt.

Figure 16:
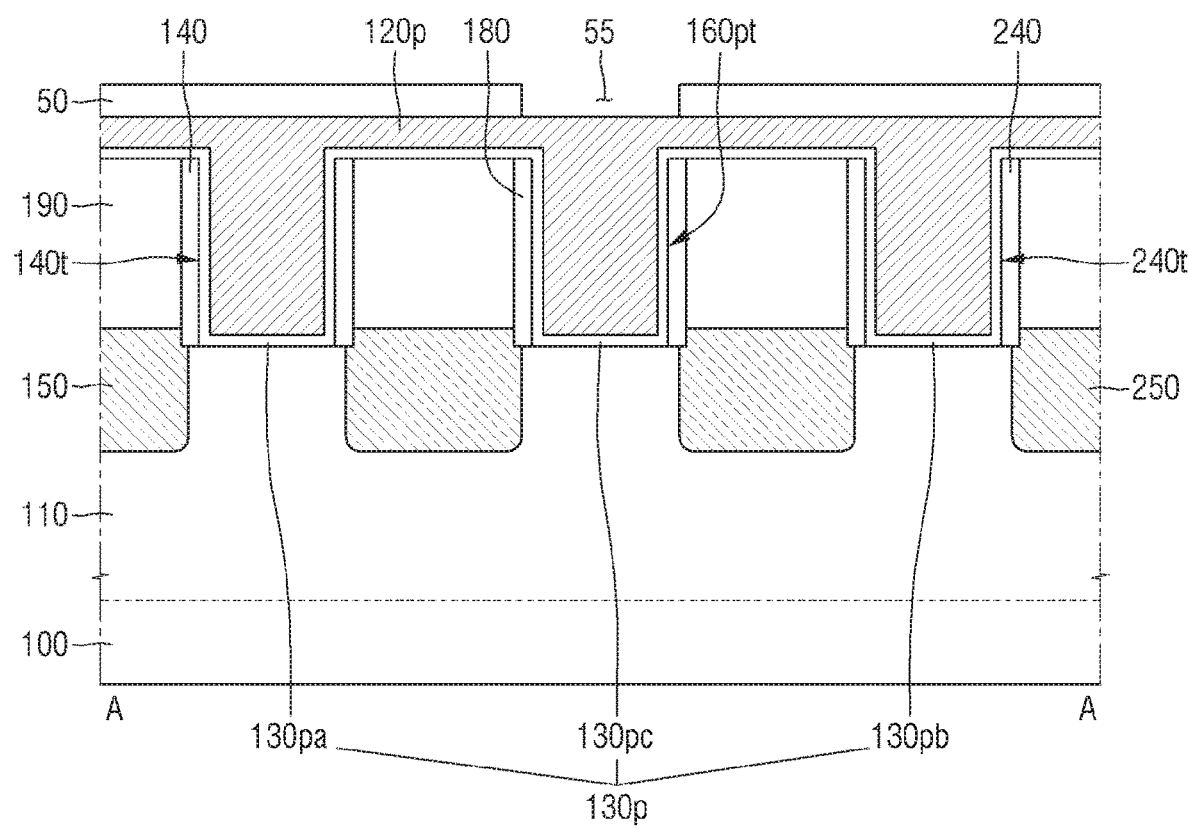

Referring to FIG. 16, a mask pattern 50 may be formed on the first pre-gate electrode 120p.

The mask pattern 50 may include an opening 55 therein. The opening 55 may overlap the third portion 130pc of the pre-high-k dielectric insulating layer 130p.

Figure 17:
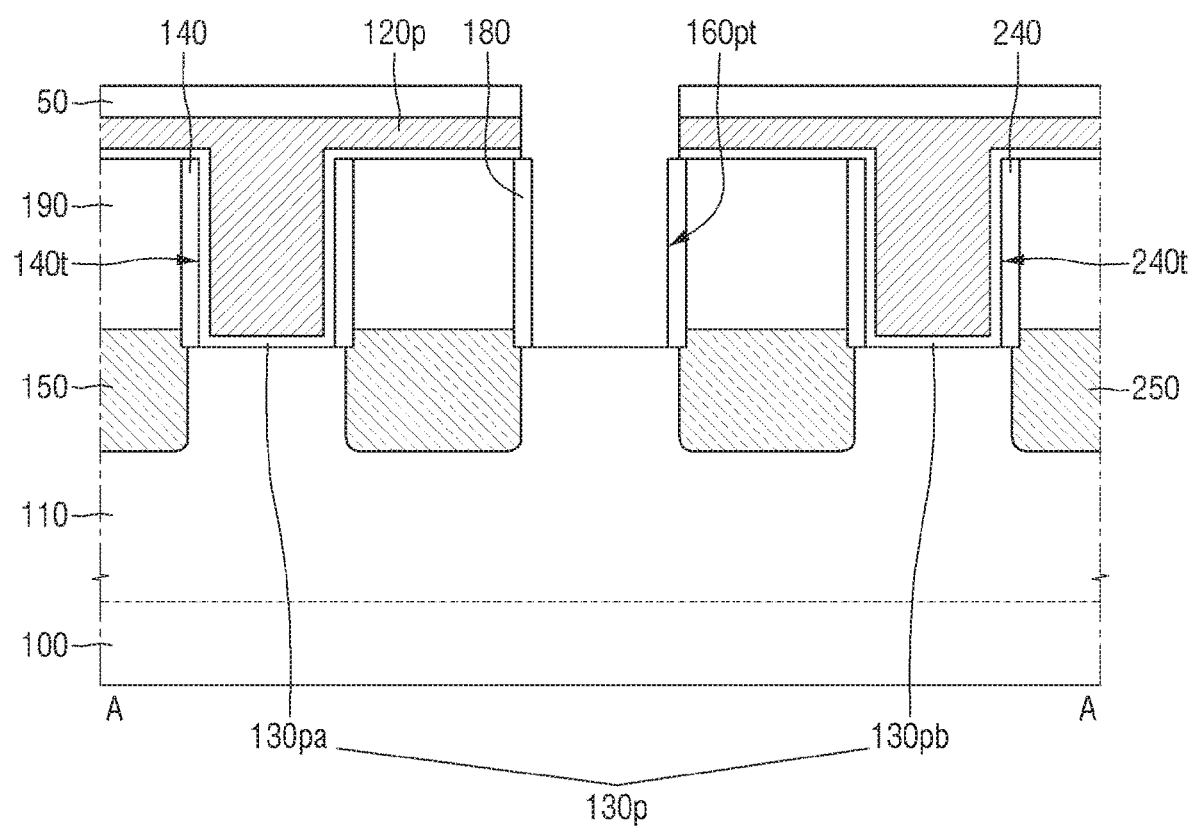
Figure 18:
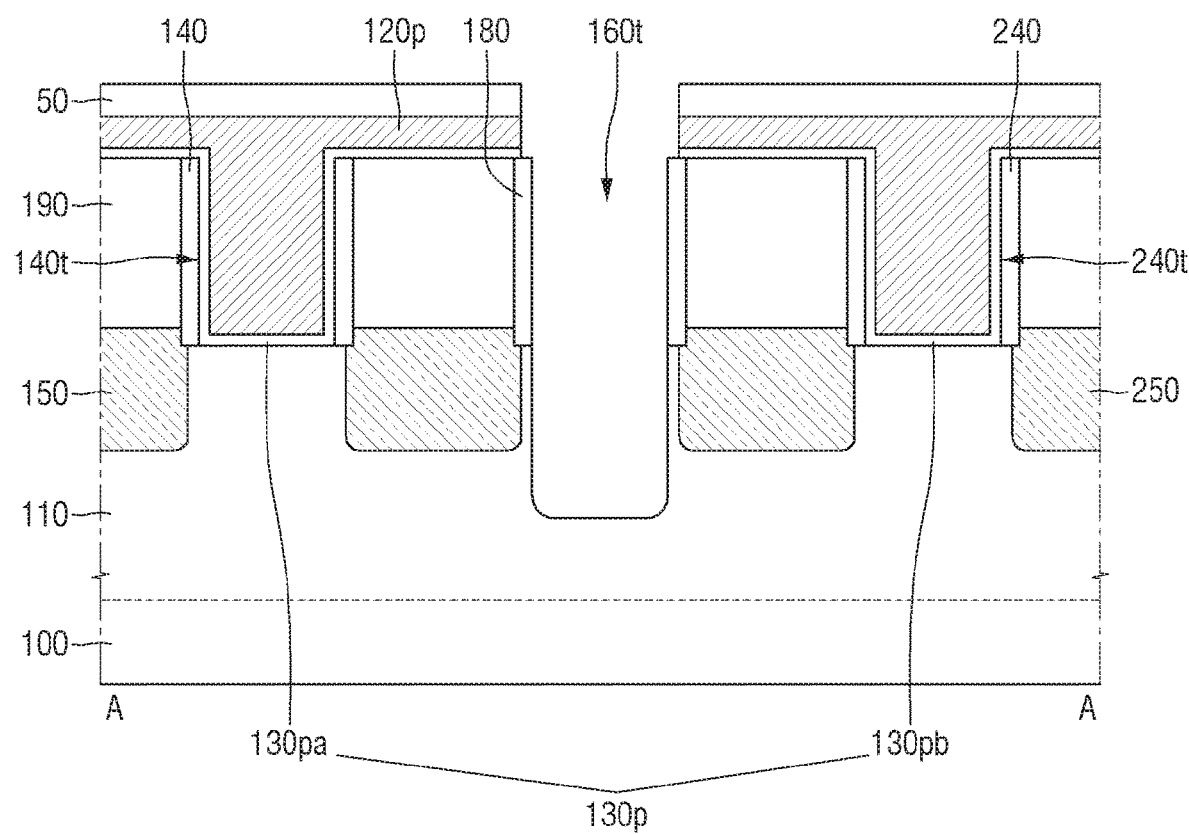

Referring to FIGS. 17 and 18, the first pre-gate electrode 120p and the third portion 130pc of the pre-high-k dielectric insulating layer 130p that are in the pre-separation trench 160pt may be removed using the mask pattern 50, such that a portion of the first fin-type pattern 110 and the sidewalls of the dummy spacers 180 may be exposed.

The portion of the first fin-type pattern 110 that is exposed by the pre-separation trench 160pt may be removed to form the separation trench 160t of which the sidewalk are defined by the dummy spacers 180 and the first fin-type pattern 110.

In some example embodiments, the portion of the first fin-type pattern 110 may be removed after the removal of a portion of the first pre-gate electrode 120p and the third portion 130pc of the pre-high-k dielectric insulating layer 130p. In other embodiments, the portion of the first fin-type pattern 110 may be removed during the removal of a portion of the first pre-gate electrode 120p and the third portion 1130pc of the pre-high-k dielectric insulating layer 130p.

Figure 19:
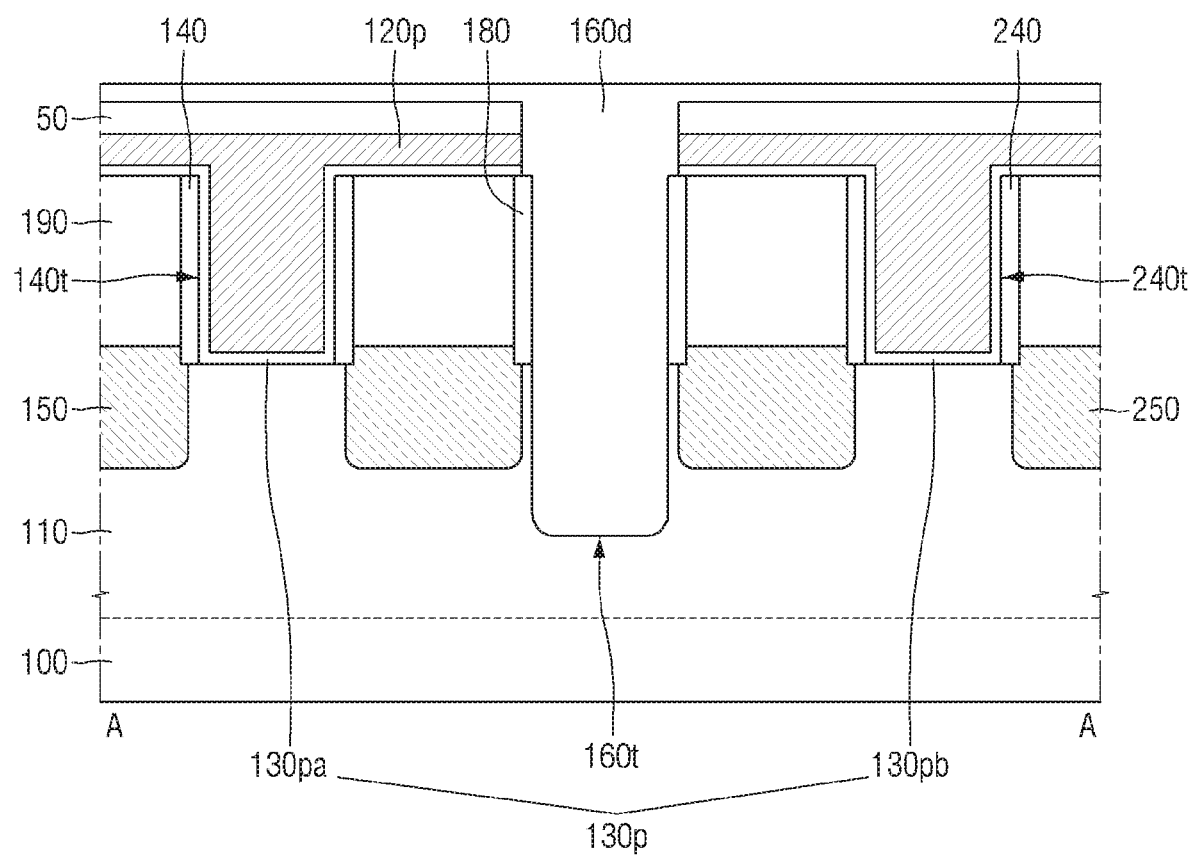
Figure 20:
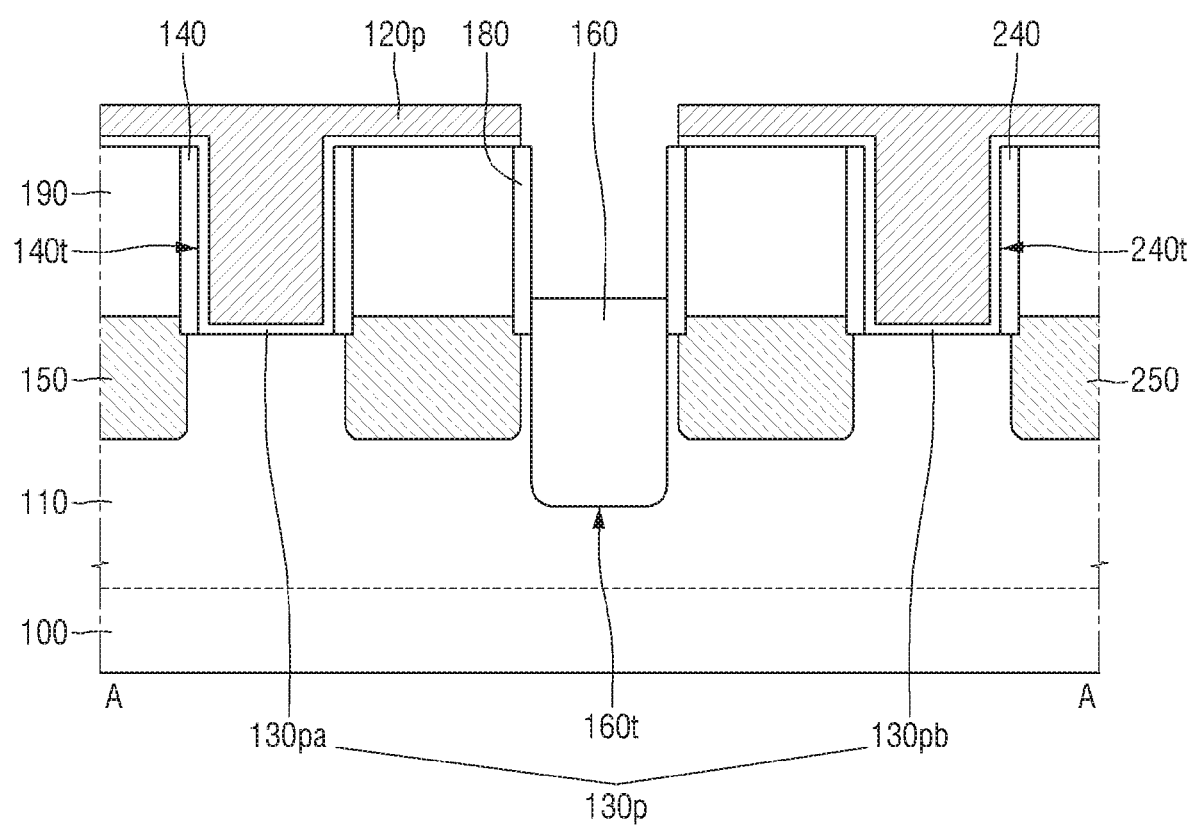

Referring to FIGS. 19 and 20, a pre-device isolation layer 160d may be formed to fill the separation trench 160t. Although the pre-device isolation layer 160d is illustrated as covering the mask pattern 50, inventive concepts are not limited thereto.

A portion of the pre-device isolation layer 160d may be removed to form the device isolation layer 160 in a portion (e.g., the lower portion) of the separation trench 160t. The device isolation layer 160 may fill the portion of the separation trench 160t.

The mask pattern 50 on the first pre-gate electrode 120p may be removed. The mask pattern 50 may be removed after or during the formation of the device isolation layer 160.

Figure 21:
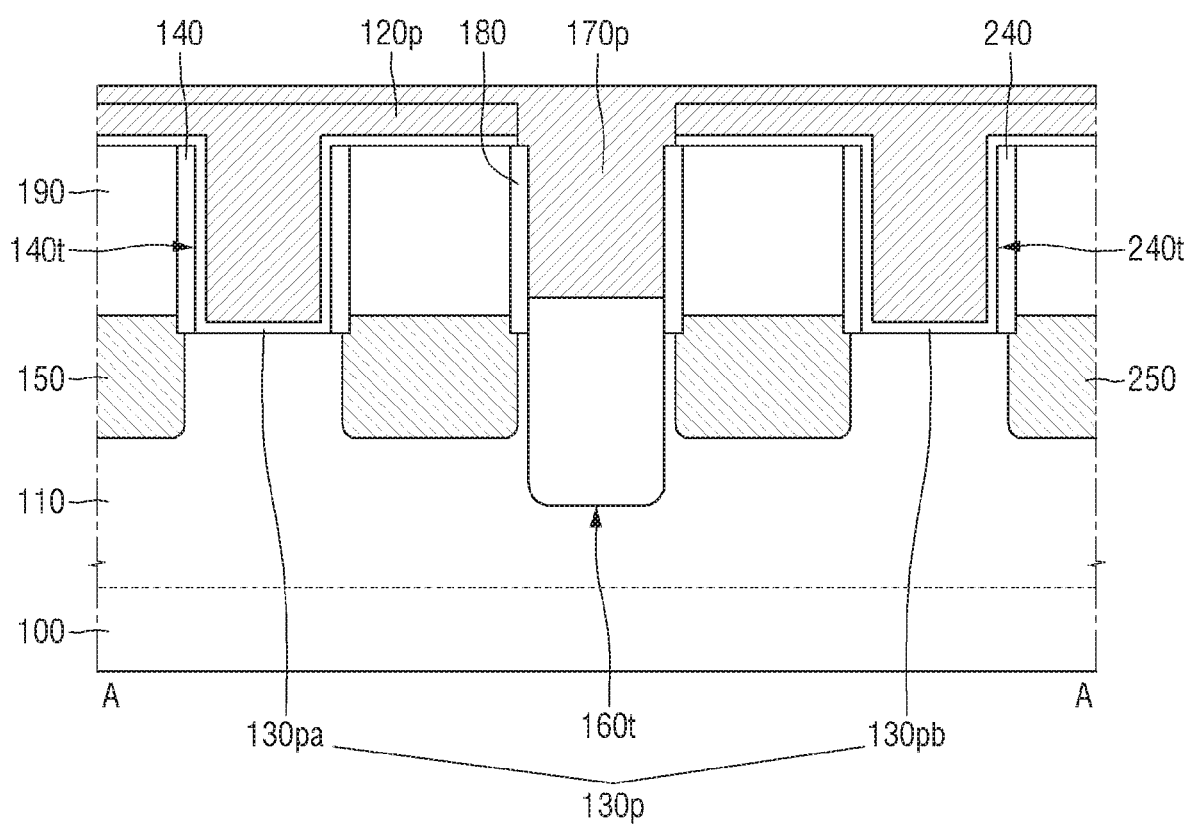

Referring to FIG. 21, a second pre-gate electrode 170p may be formed on the device isolation layer 160. The second pre-gate electrode 170p may till the separation trench 160t in which the device isolation layer 160 is formed.

The second pre-gate electrode 170p may be formed on the first pre-gate electrode 120p.

A portion of the first pre-gate electrode 120p, a portion of the second pre-gate electrode 170p, and a portion of the pre-high-k dielectric insulating layer 130p that are above the upper surface of the lower interlayer insulating layer 190 may be removed, e.g., removed through a planarization process, to expose the upper surface of the lower interlayer insulating layer 190. The planarization process may include chemical mechanical planarization (CMP); however, inventive concepts are not limited thereto.

Accordingly, for example, as shown in FIG. 2A, the first gate structure 115, the second gate structure 215, and the connection conductive pattern 170 that is on the device isolation layer 160 may be formed.

Figure 22:
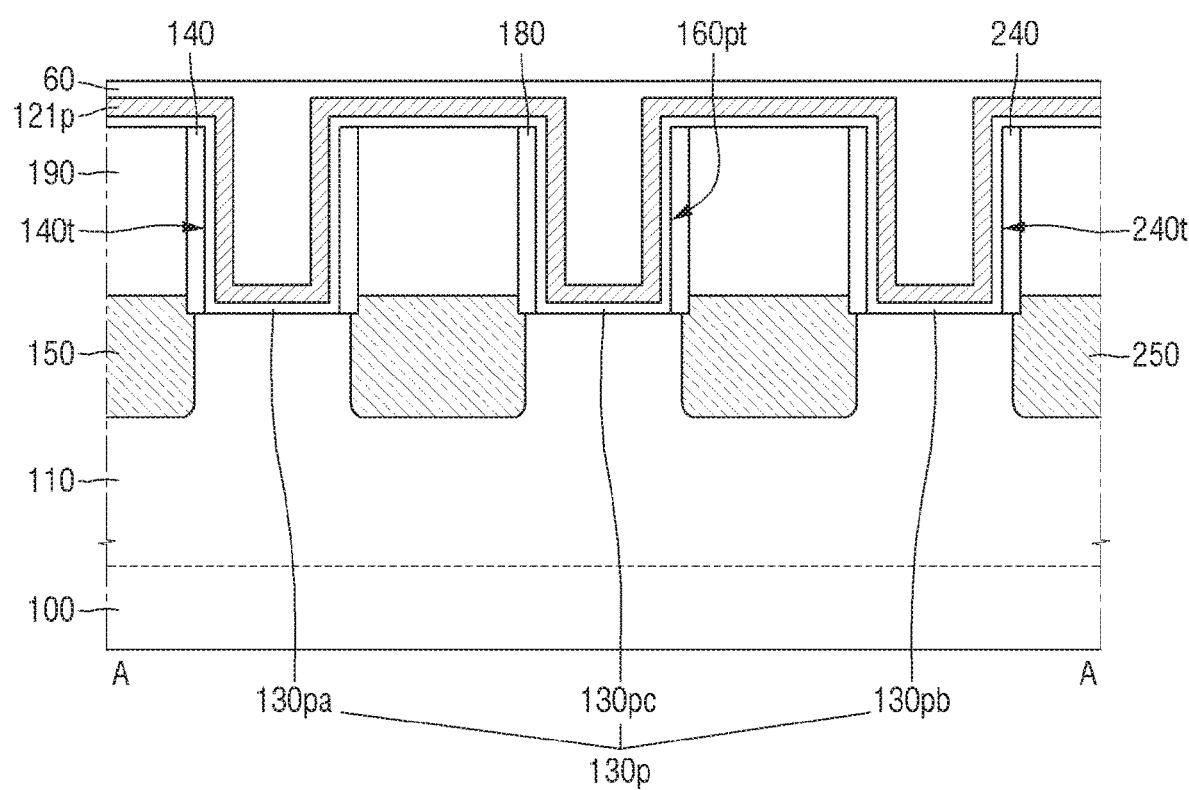
FIGS. 22 to 26 illustrate a method of manufacturing a semiconductor device according to some example embodiments.

FIGS. 22 to 25 illustrate a method of manufacturing a semiconductor device. FIG. 22 illustrates a processing stage after the stage shown in FIG. 14.

Referring to FIG. 22, the pre-high-k dielectric insulating layer 130p may be formed along the inner surface of the first gate trench 140t, the inner surface of the second gate trench 240t, the inner surface of the pre-separation trench 160pt, and the upper surface of the lower interlayer insulating layer 190.

A first pre-lower conductive liner layer 121p may be formed to extend along a surface of the pre-high-k dielectric insulating layer 130p.

A semiconductor capping layer 60 may be formed on the first pre-lower conductive liner layer 121p. Although it is illustrated that the semiconductor capping layer 60 fully fills the first gate trench 140t, the second gate trench 240t, and the pre-separation trench 160pt, inventive concepts are not limited thereto.

The semiconductor capping layer 60 may include, for example, polysilicon and/or amorphous silicon. The semiconductor capping layer 60 may be formed with a CVD process, such as a PECVD process; however, inventive concepts are not limited thereto.

Figure 23:
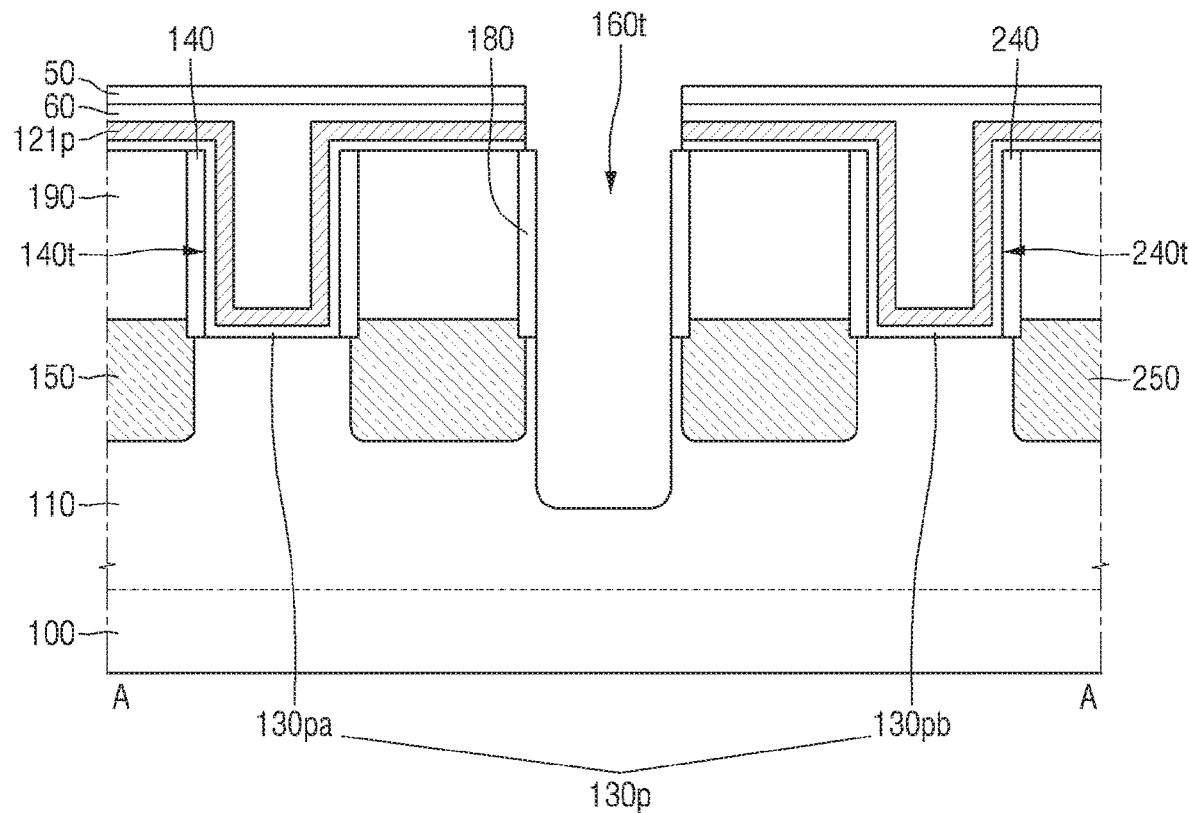

Referring to FIG. 23, the mask pattern 50 may be formed on the semiconductor capping layer 60.

The semiconductor capping layer 60, the first pre-lower conductive liner layer 121p, and the third portion 130pc of the pre-high-k dielectric insulating layer 130p that are in the pre-separation trench 160pt may be removed using the mask pattern 50.

Then, a portion of the first fin-type pattern 110 that is exposed by the pre-separation trench 160pt may be removed to form the separation trench 160t of which the sidewalls are defined by the dummy spacers 180 and the first fin-type pattern 110.

Figure 24:
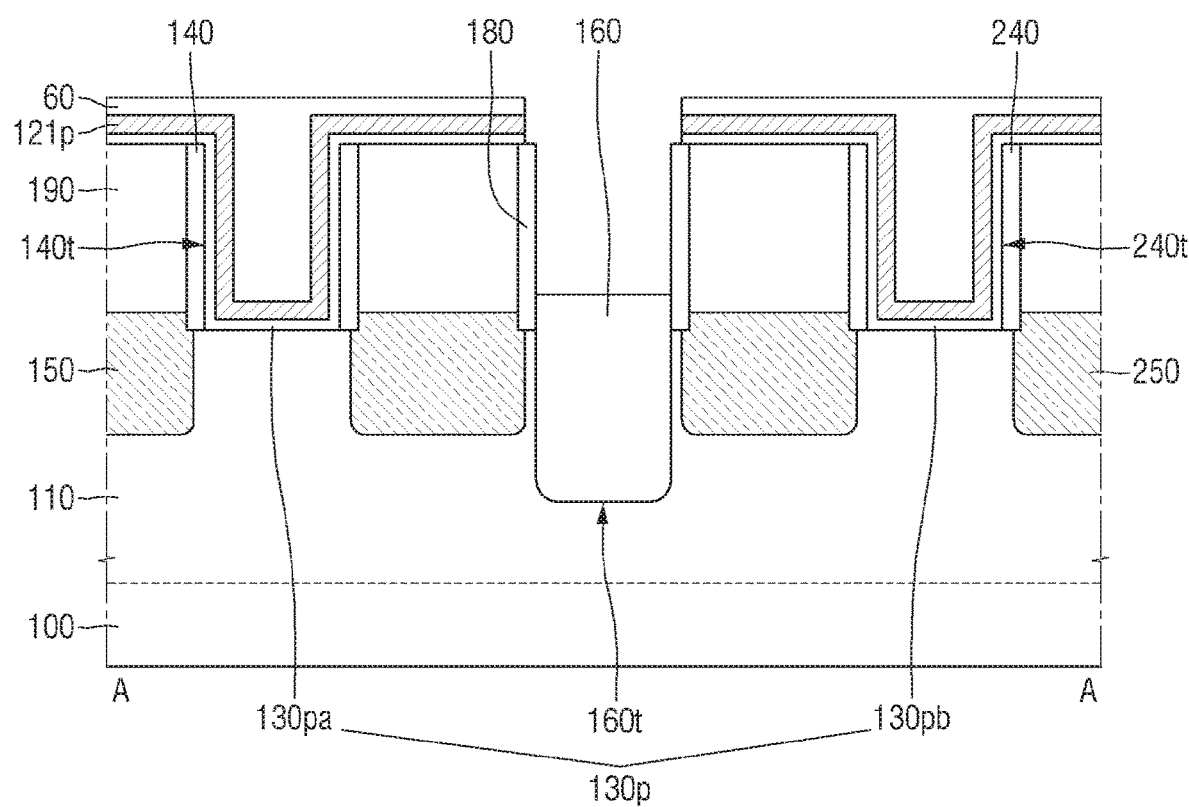

Referring to FIG. 24, the device isolation layer 160 may be formed in a portion of the separation trench 160t. The mask pattern 50 on the semiconductor capping layer 60 may be removed. For example, the mask pattern 50 may be removed with an aching process; however, inventive concepts are not limited thereto.

An anneal process may be performed on the resulting structure where the semiconductor capping layer 60 is formed.

Figure 25:
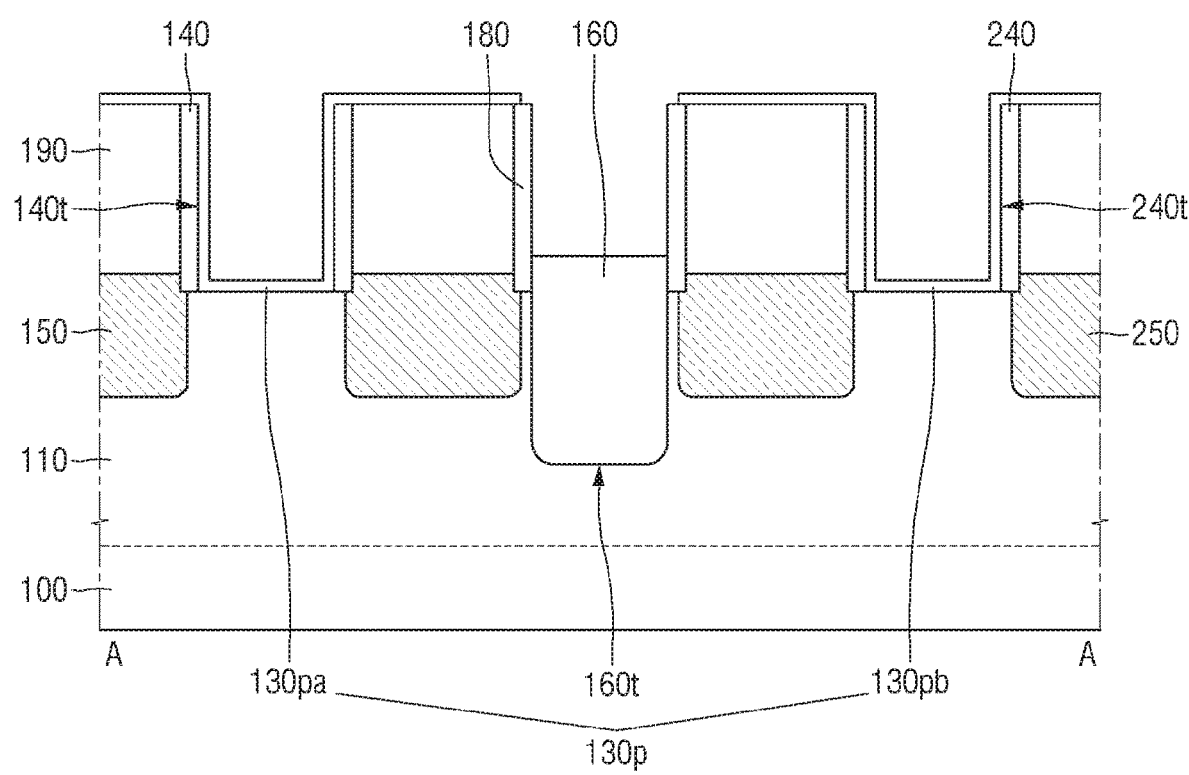

Referring to FIG. 25, the semiconductor capping layer 60 on the first pre-lower conductive liner layer 121p may be removed.

The first pre-lower conductive liner layer 121p on the pre-high-k dielectric insulating layer 130p may be removed. Thus, the first portion 130pa and second portion 130pb of the pre-high-k dielectric insulating layer 130p may be exposed.

Figure 26:
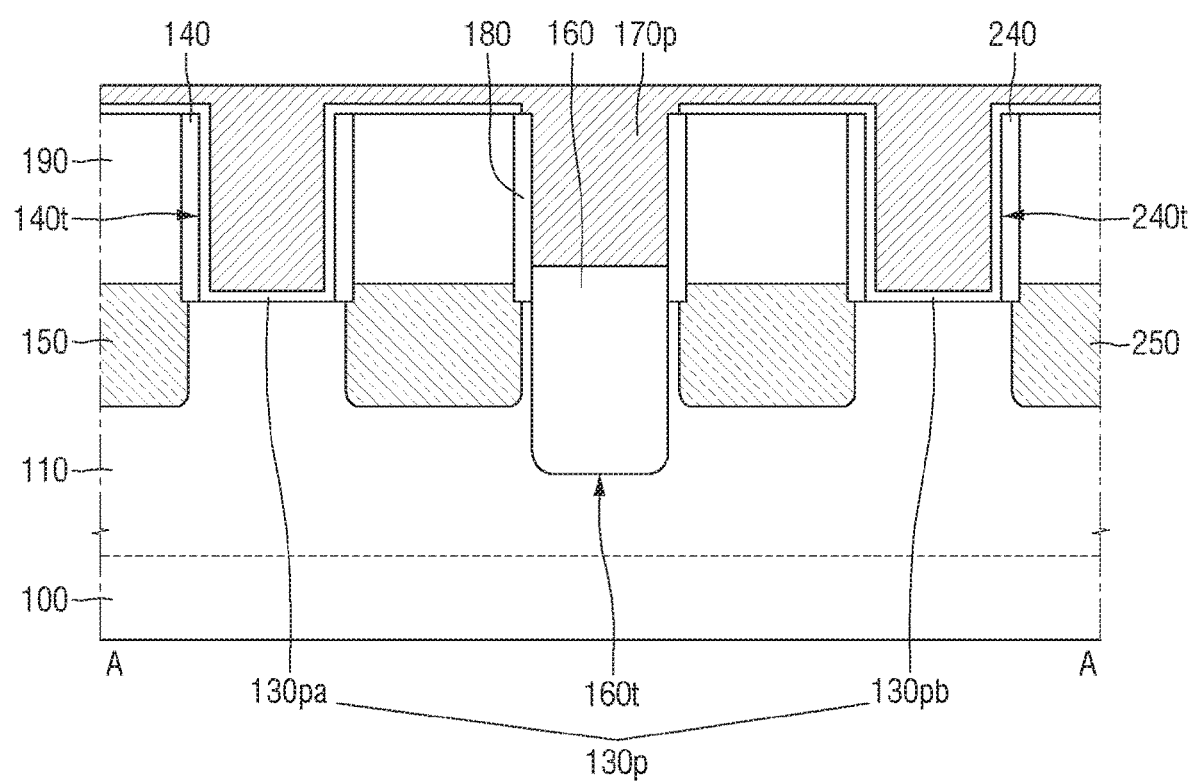

Referring to FIG. 26, the second pre-gate electrode 170p may be formed on the device isolation layer 160. The second pre-gate electrode 170p may fill the separation trench 160t in which the device isolation layer 160 is formed.

The second pre-gate electrode 170p may be formed on the first portion 130pa and the second portion 130pb of the pre-high-k dielectric insulating layer 130p and may fill the first gate trench 140t and the second gate trench 240t.

A portion of the second pre-gate electrode 170p and a portion of the pre-high-k dielectric insulating layer 130p that are above the upper surface of the lower interlayer insulating layer 190 may be removed, e.g., removed through a planarization process, to expose the upper surface of the lower interlayer insulating layer 190.

Thus, for example, as shown in FIG. 2A, the first gate structure 115, the second gate structure 215, and the connection conductive pattern 170 that is on the device isolation layer 160 may be formed.

Figure 27:
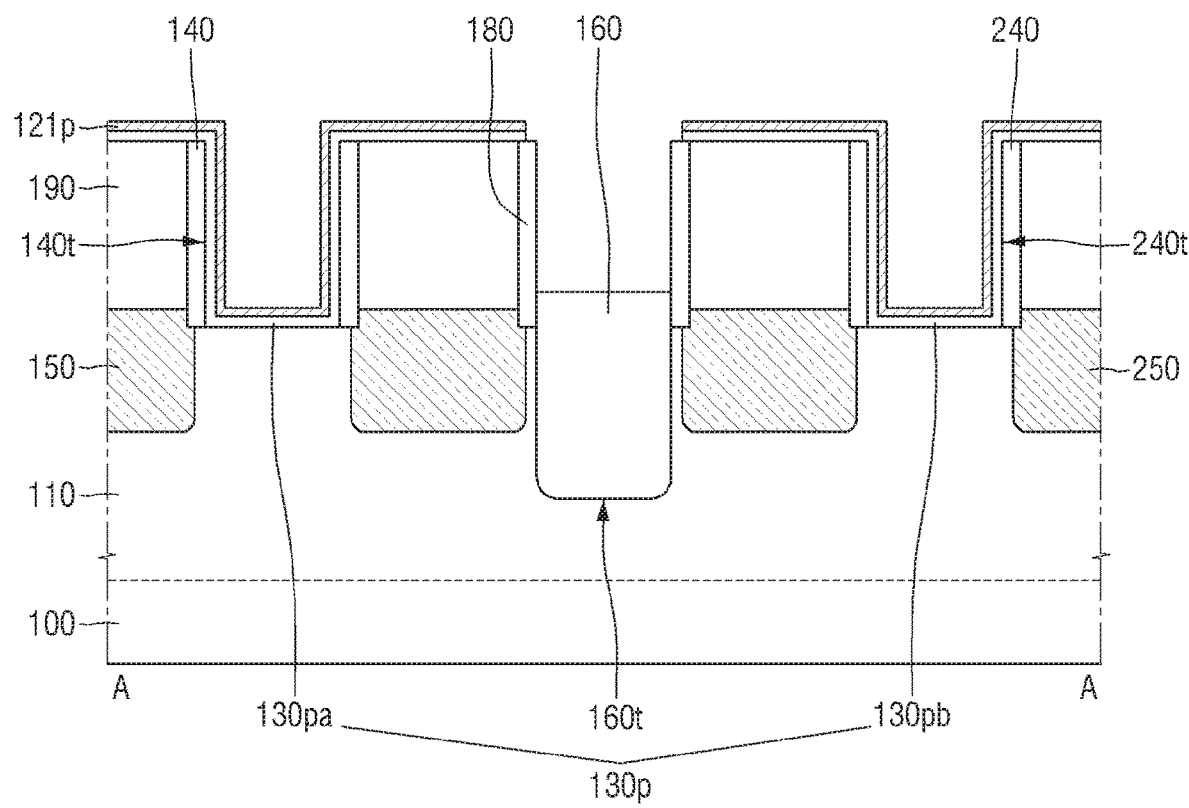
FIGS. 27 and 28 illustrate a method of manufacturing a semiconductor device according to some example embodiments.
Figure 28:
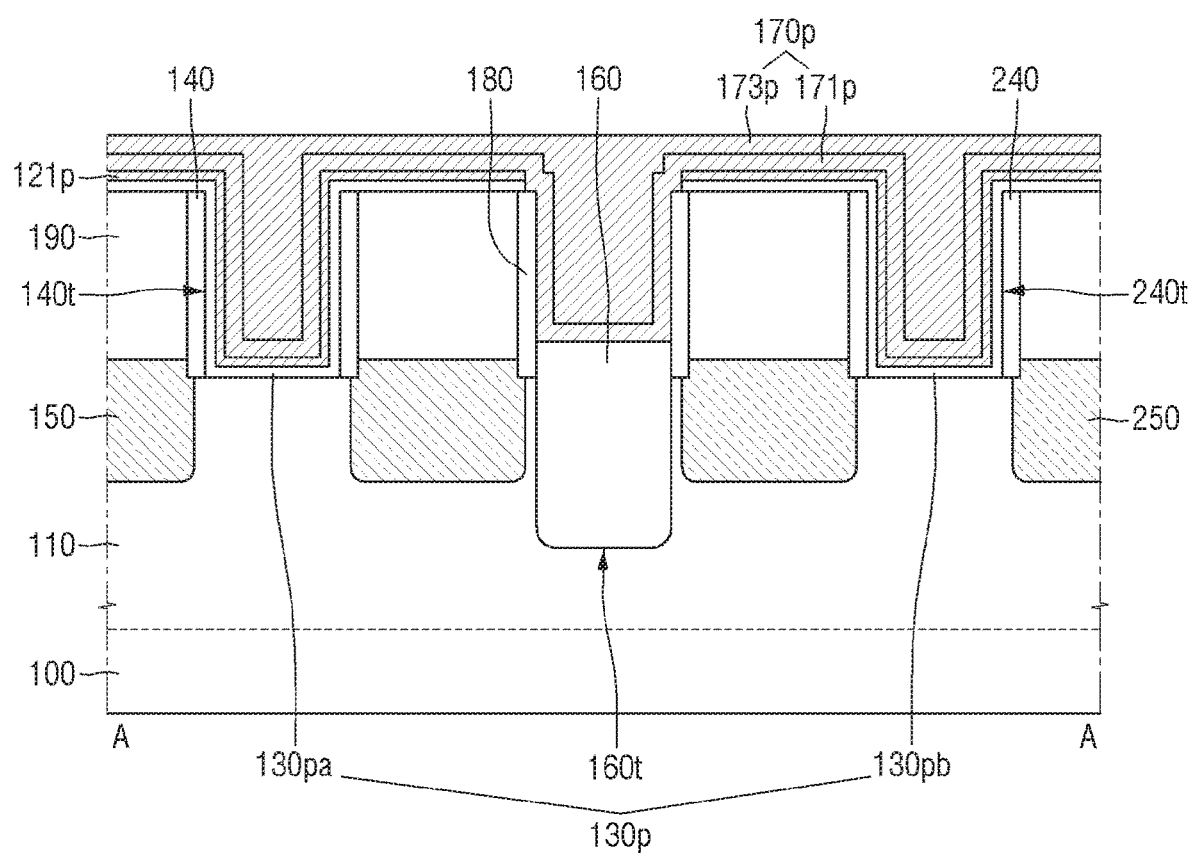

FIGS. 27 and 28 illustrate a method of manufacturing a semiconductor device. FIG. 27 illustrates a processing stage after the stage shown in FIG. 24

Referring to FIG. 27, the semiconductor capping layer 60 on the first pre-lower conductive liner layer 121*p* may be removed, thereby exposing the first pre-lower conductive liner layer 121*p*.

The first pre-lower conductive liner layer 121*p* may remain on the inner surfaces of the first gate trench 140*t* and second gate trench 240*t*.

Referring to FIG. 28, the second pre-gate electrode 170*p* may be formed on the first pre-lower conductive liner layer 121*p* and the device isolation layer 160.

The second pre-gate electrode 170*p* may fill the first gate trench 140*t*, the second gate trench 240*t*, and the separation trench 160*t*.

The second pre-gate electrode 170*p* may include a second pre-lower conductive liner layer 171*p* and a second pre-upper conductive layer 173*p* on the second pre-lower conductive liner layer 171*p*.

The second pre-lower conductive liner layer 171*p* may be formed to extend along a surface of the first pre-lower conductive liner layer 121*p*, the sidewalls of the separation trench 160*t*, and the upper surface of the device isolation layer 160.

A portion of the second pre-gate electrode 170*p*, a portion of the first pre-lower conductive liner layer 121*p*, and a portion of the pre-high-k dielectric insulating layer 130*p* that are above the upper surface of the lower interlayer insulating layer 190 may be removed, e.g., removed through a planarization process such as a CMP process, exposing the upper surface of the lower interlayer insulating layer 190.

Thus, for example, as shown in FIG. 7, the first gate structure 115, the second gate structure 215, and the connection conductive pattern 170 that is on the device isolation layer 160 may be formed.

While inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising:
a fin-type pattern on a substrate;
a first gate structure on the fin-type pattern, the first gate structure including first gate spacers and a first gate insulating layer extending along sidewalls of the first gate spacers;
a second gate structure on the fin-type pattern, the second gate structure being spaced apart from the first gate structure and including second gate spacers and a second gate insulating layer extending along sidewalls of the second gate spacers;
a pair of dummy spacers between the first gate structure and the second gate structure;
a separation trench between the pair of dummy spacers, the separation trench having sidewalls defined by the pair of dummy spacers and the fin-type pattern;
a device isolation layer in a portion of the separation trench, upper portions of vertical sidewalls of the device isolation layer contacting the pair of dummy spacers; and
a connection conductive pattern on the device isolating layer and in the separation trench, the connection conductive pattern contacting the pair of dummy spacers.

2. The semiconductor device according to claim 1, wherein
the first gate insulating layer and the second gate insulating layer include a high-k dielectric material, and
an insulating layer including the high-k dielectric material is not formed between the connection conductive pattern and the pair of dummy spacers.

3. The semiconductor device according to claim 1, wherein the device isolation layer protrudes above an upper surface of the fin-type pattern.

4. The semiconductor device according to claim 1, wherein the separation trench includes an upper portion and a lower portion, and
the device isolation layer fills the lower portion of the separation trench.

5. The semiconductor device according to claim 4, wherein the device isolation layer includes:
an insulating liner extending an inner surface of the lower portion of the separation trench; and
a filling insulating layer on the insulating liner.

6. The semiconductor device according to claim 1, wherein
the first gate structure further includes a first gate electrode on the first gate insulating layer, and
a width of the first gate electrode is different from a width of the connection conductive pattern.

7. The semiconductor device according to claim 1, wherein a height from an upper surface of the fin-type pattern to an upper surface of one of the first gate spacers is equal to a height from the upper surface of the fin-type pattern to an upper surface of one of the pair of dummy spacers.

8. The semiconductor device according to claim 1, wherein a height from a bottom surface of the separation trench to an upper surface of the fin-type pattern is less than a height of the fin-type pattern.

9. The semiconductor device according to claim 1, wherein
the first gate structure further includes a gate electrode and a capping pattern on the gate electrode, and
an upper surface of the capping pattern is coplanar with an upper surface of one of the first gate spacers.

10. A semiconductor device comprising:
a fin-type pattern extending a first direction on a substrate;
a first gate structure on the fin-type pattern, the first gate structure including first gate spacers defining a first gate trench and a first gate electrode filling at least a portion of the first gate trench;
a second gate structure on the fin-type pattern, the second gate structure including second gate spacers defining a second gate trench and a second gate electrode filling at least a portion of the second gate trench;
dummy spacers between the first gate structure and the second gate structure;
a separation trench between the dummy spacers, the separation trench having sidewalls defined by the dummy spacers and the fin-type pattern;
a device isolation layer in a portion of the separation trench, wherein upper portions of vertical sidewalls of the device isolation layer overlap lower portions of vertical sidewalls of a pair of the dummy spacers in the first direction; and a connection conductive pattern on the device isolation layer and in the separation trench, a width of the connection conductive pattern being greater than a width of each of the first and second gate electrodes.

11. The semiconductor device according to claim 10, wherein the first gate structure further includes a first gate insulating layer being between the first gate electrode and the fin-type pattern and extending along an inner surface of the first gate trench, and the connection conductive pattern contacts the dummy spacers and the device isolation layer.

12. The semiconductor device according to claim 11, wherein the first gate insulating layer includes a high-k dielectric material, and the high-k dielectric material is not between the connection conductive pattern and the dummy spacers.

13. The semiconductor device according to claim 10, wherein the first gate electrode includes a first conductive liner layer extending along an inner surface of the first gate trench and a first filling conductive layer, on the first conductive liner layer, filling the first gate trench, the connection conductive pattern includes a second conductive liner layer extending along sidewalls of the dummy spacers and an upper surface of the device isolation layer and a second filling conductive layer, on the second conductive liner layer, filling the separation trench, the first filling conductive layer includes the same material as the second filling conductive layer, and a width of the second filling conductive layer is greater than a width of the first filling conductive layer.

14. The semiconductor device according to claim 13, wherein the first conductive liner layer includes a first lower conductive liner layer and a first upper conductive liner layer, and the connection conductive pattern does not include the first lower conductive liner layer.

15. The semiconductor device according to claim 10, wherein the first gate electrode includes a first conductive liner layer extending along an inner surface of the first gate trench and a first filling conductive layer, on the first conductive liner layer, filling the first gate trench, the connection conductive pattern includes a second conductive liner layer extending along sidewalls of the dummy spacers and an upper surface of the device isolation layer and a second filling conductive layer, on the second conductive liner layer, filling the separation trench, and the first filling conductive layer includes a different material from the second filling conductive layer.

16. The semiconductor device according to claim 10, further comprising:

a first epitaxial pattern between the first gate structure and the device isolation layer, wherein a vertical distance from an upper surface of the fin-type pattern to a lower surface of the first epitaxial pattern is less than a vertical distance from the upper surface of the fin-type pattern to a lower surface of the device isolation layer.

17. A semiconductor device comprising:

a fin-type pattern extending a first direction on a substrate;

a first gate structure on the fin-type pattern, the first gate structure including first gate spacers defining a first gate trench and a first gate insulating layer extending along an inner surface of the first gate trench;

a second gate structure on the fin-type pattern, the second gate structure including second gate spacers defining a second gate trench, and a second gate insulating layer extending along an inner surface of the second gate trench;

dummy spacers between the first gate structure and the second gate structure;

a separation trench between the dummy spacers, the separation trench having sidewalls defined by the dummy spacers and the fin-type pattern;

a device isolation layer in a portion of the separation trench, the device isolation layer having an upper surface higher than an upper surface of the fin-type pattern with respect to an upper surface of the substrate, wherein upper portions of vertical sidewalls of the device isolation layer overlap lower portions of vertical sidewalls of a pair of the dummy spacers in the first direction; and a connection conductive pattern on the device isolation layer and in the separation trench, wherein the first and second gate insulating layers include a high-k dielectric material, and an insulating layer including the high-k dielectric material is not formed between the connection conductive pattern and the device isolation layer.

18. The semiconductor device according to claim 17, wherein the connection conductive pattern contacts the dummy spacers and the device isolation layer.

19. The semiconductor device according to claim 17, wherein the first gate structure further includes a first gate electrode on the first gate insulating layer filling the first gate trench, and a width of the first gate electrode is less than a width of the connection conductive pattern.

20. The semiconductor device according to claim 19, wherein the first gate electrode includes first stacked conductive layers, the connection conductive pattern includes second stacked conductive layers, and a number of the first stacked conductive layers in the first gate electrode is greater than or equal to a number of the second stacked conductive layers in the connection conductive pattern.

* * * * *